(12) United States Patent
Sagae et al.

(10) Patent No.: US 8,232,827 B2
(45) Date of Patent: Jul. 31, 2012

(54) SEMICONDUCTOR SWITCH

(75) Inventors: Yoshitomo Sagae, Kanagawa-ken (JP);
Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 12/726,528

(22) Filed: Mar. 18, 2010

(65) Prior Publication Data

US 2011/0050288 A1 Mar. 3, 2011

(30) Foreign Application Priority Data

Aug. 31, 2009 (JP) ................................. 2009-200647

(51) Int. Cl.
*H03L 5/00* (2006.01)
(52) U.S. Cl. ........................ 327/308; 327/365; 327/427
(58) Field of Classification Search .................. 327/308, 327/365, 376, 377, 427
See application file for complete search history.

(56) References Cited

U.S. PATENT DOCUMENTS

| | | | |
|---|---|---|---|
| 6,804,502 B2 | 10/2004 | Burgener et al. | |
| 7,148,737 B2 * | 12/2006 | Seshita et al. | 327/427 |
| 7,173,471 B2 * | 2/2007 | Nakatsuka et al. | 327/308 |
| 7,619,462 B2 * | 11/2009 | Kelly et al. | 327/427 |

FOREIGN PATENT DOCUMENTS

| | | |
|---|---|---|
| JP | 06-085641 | 3/1994 |
| JP | 08-293776 | 11/1996 |
| JP | 2005515657 | 5/2005 |
| JP | 2008-109591 | 5/2008 |
| JP | 2009-027487 | 2/2009 |

OTHER PUBLICATIONS

Japanese Office Action for Japanese Application No. 2009-200647 mailed on Dec. 14, 2011.

* cited by examiner

*Primary Examiner* — Hai L Nguyen
(74) *Attorney, Agent, or Firm* — Turocy & Watson, LLP

(57) ABSTRACT

A semiconductor switch includes: a first terminal; a second terminal; a switch section including a through FET connected between the first terminal and the second terminal and a shunt FET connected between the second terminal and a first ground terminal; a first control terminal configured to drive the through FET; a second control terminal configured to drive the shunt FET; and a driver provided on a substrate together with the switch section and configured to provide a differential output to the first control terminal and the second control terminal.

5 Claims, 20 Drawing Sheets

SEMICONDUCTOR SWITCH

CROSS-REFERENCE TO RELATED APPLICATIONS

This application is based upon and claims the benefit of priority from the prior Japanese Patent Application No. 2009-200647, filed on Aug. 31, 2009; the entire contents of which are incorporated herein by reference.

BACKGROUND

1. Field

Embodiments of the invention relate generally to a semiconductor switch.

2. Background Art

Cell phones include a radio frequency circuit section in which a transmit circuit and a receive circuit are selectively connected to a common antenna through a switch circuit for radio frequency signals. The switch element of such a switch circuit for radio frequency signals has conventionally been based on a HEMT (high electron mobility transistor) made of compound semiconductor. Recently, replacement of the HEMT by a MOSFET (metal oxide semiconductor field effect transistor) formed on a silicon substrate has been under consideration in view of requirements for cost reduction and downsizing.

However, the conventional MOSFET formed on a silicon substrate has large parasitic capacitance between the source or drain electrode and the silicon substrate. Another problem is that the radio frequency signal incurs large power loss because silicon is a semiconductor. In this context, a technique is proposed for forming a switch circuit for radio frequency signals on an SOI (silicon on insulator) substrate (see, e.g., JP-T-2005-515657).

However, further improvement is required for inter-terminal isolation and insertion loss. For instance, a switch for switching high-definition digital television signals requires an isolation of 75 dB or more at a frequency of 1 GHz.

SUMMARY

According to an aspect of the invention, there is provided a semiconductor switch including: a first terminal; a second terminal; a switch section including a through FET connected between the first terminal and the second terminal and a shunt FET connected between the second terminal and a first ground terminal; a first control terminal configured to drive the through FET; a second control terminal configured to drive the shunt FET; and a driver provided on a substrate together with the switch section and configured to provide a differential output to the first control terminal and the second control terminal.

DETAILED DESCRIPTION

Figure 1:
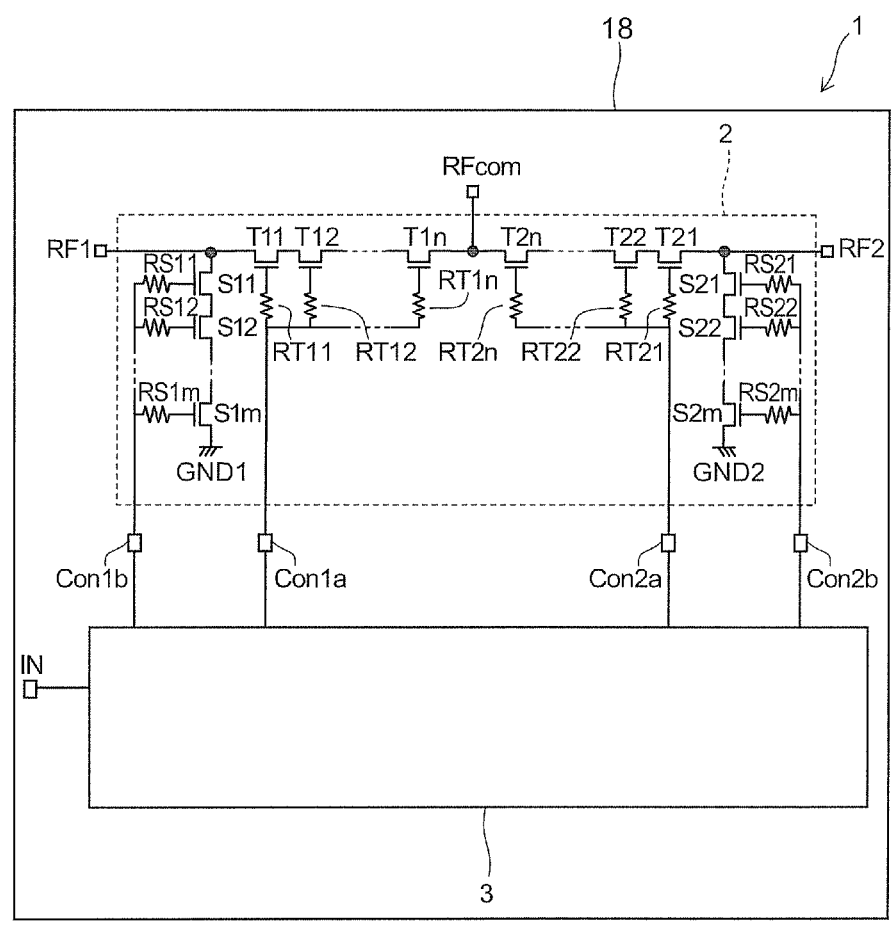
FIG. 1 is a block diagram illustrating the configuration of a switching circuit according to an embodiment of the invention.

Embodiments of the invention will now be described in detail with reference to the drawings.

In the present specification and drawings, elements similar to those described previously with reference to earlier figures are labeled with like reference numerals, and the detailed description thereof is omitted as appropriate.

FIG. 1 is a block diagram illustrating the configuration of a semiconductor switch according to an embodiment of the invention.

As shown in FIG. 1, the semiconductor switch 1 includes a switch section 2 and a controller section 3. These are formed in the same substrate 18 (semiconductor switch substrate) to provide a one-chip structure.

The switch section 2 illustratively has a configuration for switching the connection state between a first terminal RFcom and two second terminals RF1, RF2.

The controller section 3 switches the connection state of the switch section 2. It is noted that the controller section 3 may be part of a circuit for controlling the switch section 2.

The semiconductor switch 1 is an SPDT (single-pole double-throw) switch.

First, the switch section 2 is described.

As shown in FIG. 1, n stages (n being a natural number) of through FETs (field effect transistors) T11, T12, ..., T1n, T21, T22, ..., T2n are connected in series between the first terminal RFcom and each of the second terminals RF1, RF2.

The through FETs T11, T12, ..., T1n are connected between the first terminal RFcom and the second terminal RF1. The through FETs T21, T22, ..., T2n are connected between the first terminal RFcom and the second terminal RF2.

Between each of the second terminals RF1, RF2 and each of first ground terminals GND1, GND2, m stages (m being a natural number) of shunt FETs S11, S12, ..., S1m, S21, S22, ..., S2m are connected in series. The shunt FETs S11, S12, ..., S1m are connected between the second terminal RF1 and the first ground terminal GND1. The shunt FETs S21, S22, ..., S2m are connected between the second terminal RF2 and the first ground terminal GND2.

The gates of the through FETs T11, T12, ..., T1n connected to the second terminal RF1 are connected to a first control terminal Con1a respectively through resistors RT11, RT12, ..., RT1n for preventing leakage of radio frequency. The first control terminal Con2a is connected to the controller section 3. The resistors RT11, RT12, ..., RT1n each have a resistance high enough to avoid leakage of radio frequency signals to the controller section 3.

The gates of the shunt FETs S11, S12, ..., S1m connected to the second terminal RF1 are connected to a second control terminal Con1b respectively through resistors RS11, RS12, ..., RS1m for preventing leakage of radio frequency. The second control terminal Con1b is connected to the controller section 3. The resistors RS11, RS12, ..., RS1m each have a resistance high enough to avoid leakage of radio frequency signals to the controller section 3.

The gates of the through FETs T21, T22, ..., T2n connected to the second terminal RF2 are connected to a first control terminal Con2a respectively through resistors RT21, RT22, ..., RT2n for preventing leakage of radio frequency. The first control terminal Con2a is connected to the controller section 3. The resistors RT21, RT22, ..., RT2n each have a resistance high enough to avoid leakage of radio frequency signals to the controller section 3.

The gates of the shunt FETs S21, S22, ..., S2m connected to the second terminal RF2 are connected to a second control terminal Con2b respectively through resistors RS21, RS22, ..., RS2m for preventing leakage of radio frequency. The second control terminal Con2b is connected to the controller section 3. The resistors RS21, RS22, ..., RS2m each have a resistance high enough to avoid leakage of radio frequency signals to the controller section 3.

During turn-off of the through FETs connected to the second terminal to which the shunt FET is connected, the shunt FET enhances isolation between that second terminal and the first terminal. More specifically, even when the through FET is turned off, a radio frequency signal may leak to the second terminal connected to that through FET in the OFF state. At this time, the leaked radio frequency signal can be dissipated to the ground through the shunt FET in the ON state.

For instance, for conduction between the second terminal RF1 and the first terminal RFcom, the n stages of series connected through FETs T11-T1n between the second terminal RF1 and the first terminal RFcom are turned on, and the m stages of series connected shunt FETs S11-S1m between the second terminal RF1 and the ground are turned off. Simultaneously, the through FETs between the other second terminal RF2 and the first terminal RFcom are all turned off, and the shunt FETs between the other second terminal RF2 and the first ground terminal GND2 are all turned on.

In the above case, an ON potential Von is applied to the first control terminal Con1a, and an OFF potential Voff is applied to the second control terminal Con1b. Furthermore, the OFF potential Voff is applied to the first control terminal Con2a, and the ON potential Von is applied to the second control terminal Con2b. The ON potential Von is a gate potential bringing each FET into the conducting state in which its ON resistance has a sufficiently small value. The OFF potential Voff is a gate potential bringing each FET into the blocking state which can be sufficiently maintained even under superposition of a radio frequency signal. The threshold voltage Vth of each FET is illustratively 0.1 V.

If the ON potential Von is lower than a desired potential (such as 2.4 V), the ON resistance of the FET in the conducting state increases, degrading insertion loss, and distortion generated by the FET in the conducting state (ON distortion) increases. If the OFF potential Voff is higher than a desired potential (such as −1.5 V), the maximum allowable input power decreases, and distortion generated by the FET in the blocking state for rated input (OFF distortion) increases.

However, an extremely high ON potential Von or an extremely low OFF potential Voff will exceed the breakdown voltage of the FET. Hence, there is an optimal range for the ON potential Von and the OFF potential Voff.

The signal for controlling the gate potential of each FET of the switch section 2 is generated by the controller section 3.

Figure 2:
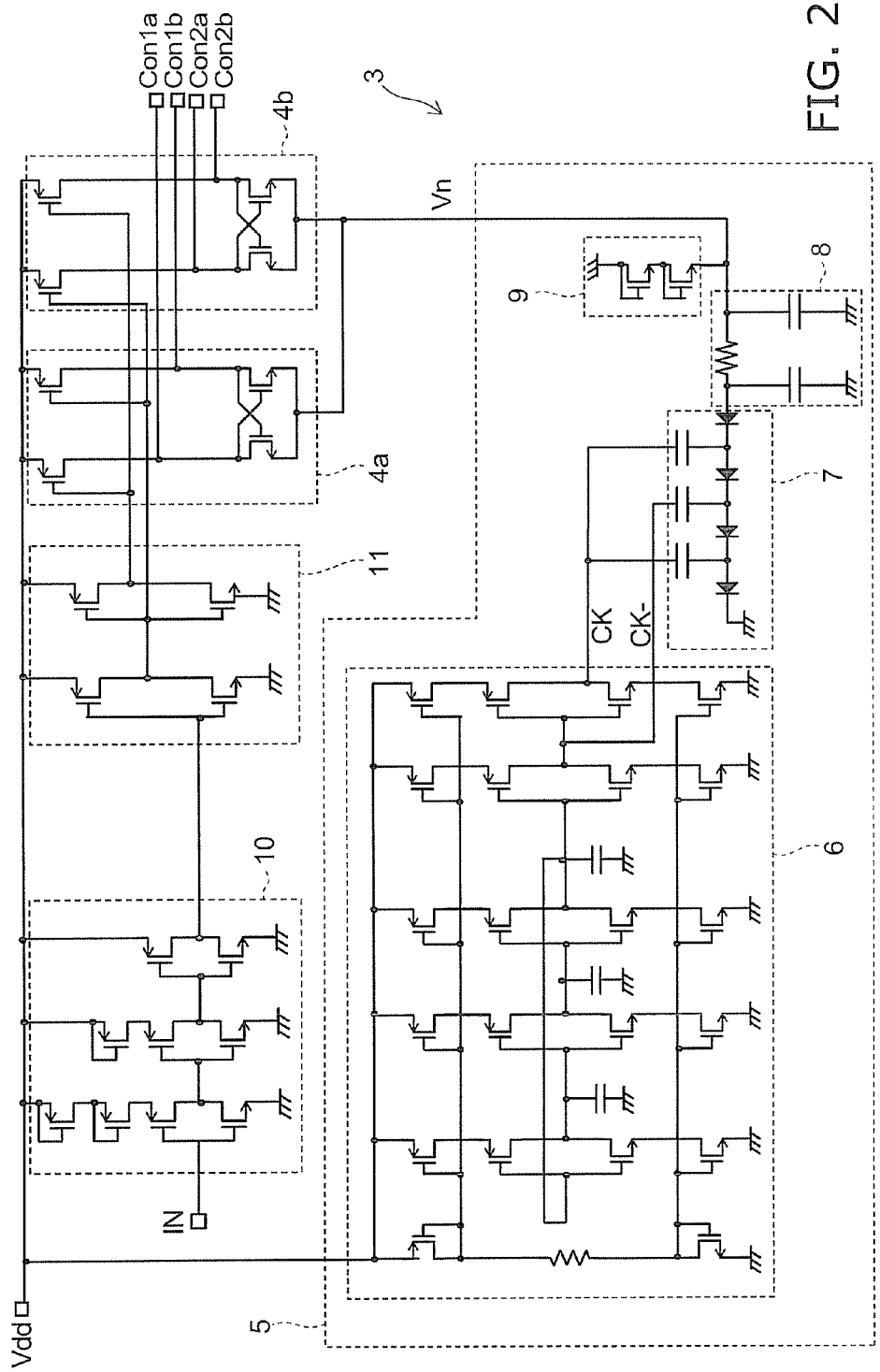
FIG. 2 is a circuit diagram illustrating the configuration of the controller section of the semiconductor switch shown in FIG. 1.

FIG. 2 is a circuit diagram illustrating the configuration of the controller section of the semiconductor switch shown in FIG. 1.

As shown in FIG. 2, the controller section 3 includes drivers 4a, 4b, a negative voltage generator (voltage generator) 5, an input interface circuit 10, and an inverted/non-inverted signal generator 11.

The power supply voltage Vdd is illustratively 2.7 V. On the other hand, the high level of the signal inputted to the external control terminal IN is lower than Vdd, illustratively 1.8 V. Hence, it is level-shifted in the input interface circuit 10.

As shown in FIG. 2, the input interface circuit 10 is composed of three stages of CMOS inverters. In the first stage, two stages of diode-connected FETs are provided at the high-potential node of a normal CMOS inverter. In the second stage, one stage of diode-connected FET is provided at the high-potential node of a normal CMOS inverter. Furthermore, the third stage is composed of a normal CMOS inverter. By this configuration, an input signal with a high level of 1.8 V is level-shifted to a signal with a high level of Vdd (2.7 V).

The output signal of the input interface circuit 10 is inputted to the inverted/non-inverted signal generator 11, which is composed of two stages of CMOS inverters. Its differential output is inputted to the drivers 4a and 4b. Here, each driver 4a, 4b is composed of a level shifter.

The negative potential Vn of the low-potential power supply of the drivers 4a, 4b is generated by the negative voltage generator (voltage generator) 5.

The negative voltage generator (voltage generator) 5 is illustratively composed of a ring oscillator 6, a charge pump 7, a low-pass filter (LPF) 8, and a clamp circuit 9. The ring oscillator 6 supplies a differential clock CK, CK− to the charge pump 7. The output of the charge pump 7 is smoothed by the low-pass filter 8, which outputs a negative potential Vn. The negative potential Vn is stabilized by the clamp circuit 9.

Here, the value of the negative potential Vn outputted from the negative voltage generator (voltage generator) 5 is illustratively −1.5 V.

In the drivers 4a, 4b, P-channel MOSFETs (hereinafter PMOSs) are provided on the high-potential power supply (power supply voltage Vdd) side, and cross-coupled N-channel MOSFETs (hereinafter NMOSs) with the gate connected to the other's drain are provided on the low-potential power supply (negative potential Vn) side.

A control signal is differentially outputted at the drain of the NMOS and the drain of the PMOS of the driver 4a. This control signal is differentially outputted to the first control terminal Con1a and the second control terminal Con1b of the switch section 2. Furthermore, a control signal is differentially outputted at the drain of the NMOS and the drain of the PMOS of the driver 4b. This control signal is differentially outputted to the first control terminal Con2a and the second control terminal Con2b of the switch section 2.

By the drivers 4a, 4b, the low level is level-shifted from 0 V to Vn (−1.5 V). More specifically, a control signal with a high level of Vdd (2.7 V) and a low level equal to the negative potential Vn (−1.5 V) is outputted to the first and second control terminals Con1a, Con1b, Con2a, Con2b. By setting the low level of the control signal to the negative potential, a switch can be realized with low distortion even for high-power input signals.

Here, the logic level of the control signal is the same for the first control terminal Con1a and the second control terminal Con2b, and the same for the second control terminal Con1b and the first control terminal Con2a.

Hence, it may be contemplated that two drivers are not needed, but only one is sufficient.

Figure 3:
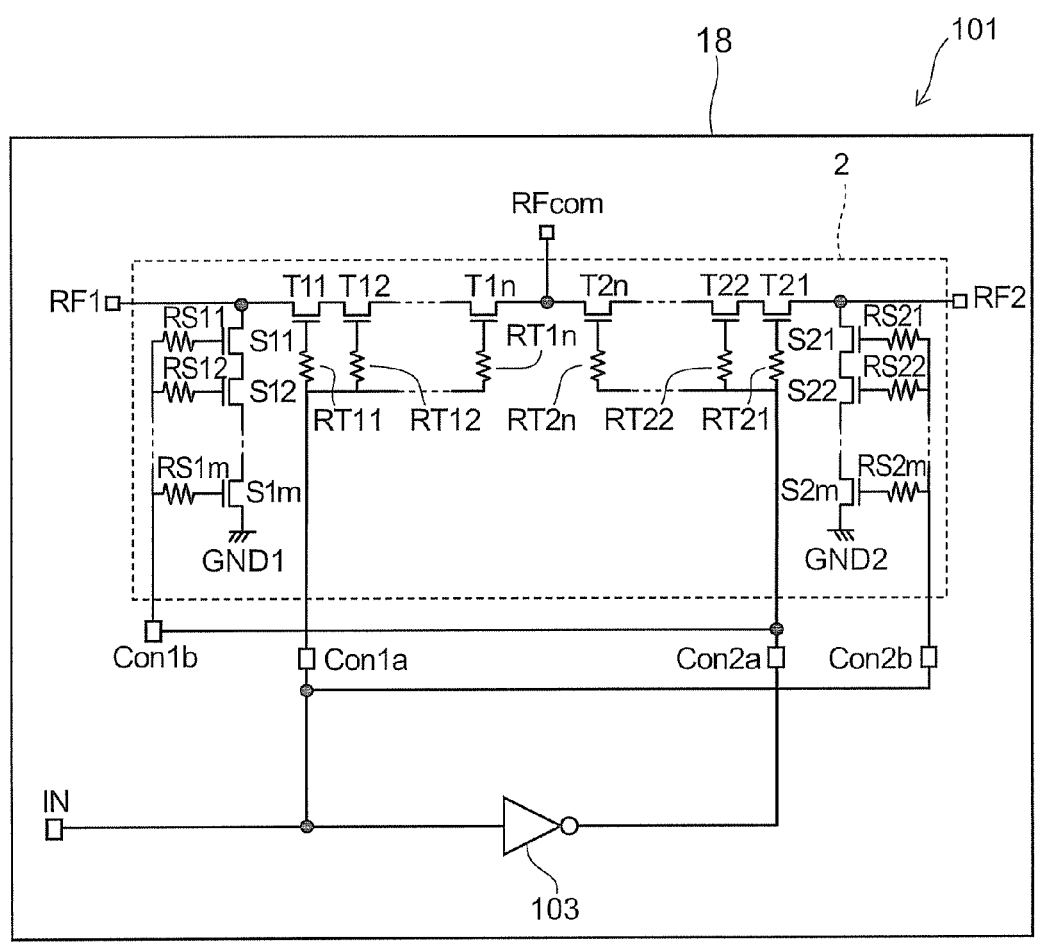
FIG. 3 is a circuit diagram illustrating the configuration of a semiconductor switch of a comparative example.

FIG. 3 is a circuit diagram illustrating the configuration of a semiconductor switch of a comparative example.

As shown in FIG. 3, the semiconductor switch 101 of the comparative example has a configuration in which the controller section 3 of the semiconductor switch 1 shown in FIG. 1 is replaced by an inverter 103. The first control terminal Con1a and the second control terminal Con2b are connected to the input end of the inverter 103. The second control terminal Con1b and the first control terminal Con2a are connected to the output end of the inverter 103.

However, if the through FETs T11, T12, . . . , T1n and the shunt FETs S21, S22, . . . , S2m connected to a plurality of second terminals RF1, RF2 are driven by the same driver, a radio frequency signal superposed on each control signal may interfere with other control signals. More specifically, if the first control terminal Con2a and the second control terminal Con1b are connected and driven by one inverter 103, interference between signals may occur and lead to isolation degradation.

Thus, the controller section 3 shown in FIG. 2 includes two drivers 4a and 4b.

More specifically, the driver 4a differentially outputs a control signal to the first control terminal Con1a and the second control terminal Con1b, which respectively drive a pair of through FETs T11, T12, . . . , T1n and shunt FETs S11, S12, . . . , S1m connected to the second terminal RF1.

The driver 4b differentially outputs a control signal to the first control terminal Con2a and the second control terminal Con2b, which respectively drive a pair of through FETs T21, T22, . . . , T2n and shunt FETs S21, S22, . . . , S2m connected to the second terminal RF2.

Thus, by providing the drivers 4a, 4b independently at the respective second terminals (respective ports), interference of radio frequency signals superposed on each control signal with other control signals is avoided.

Hence, isolation can be improved in the semiconductor switch 1.

The semiconductor switch 1 shown in FIGS. 1 and 2 is illustratively based on the configuration using the negative voltage generator (voltage generator) 5. However, if the through FETs and shunt FETs can satisfy desired loss/distortion characteristics without using the negative potential Vn, then the negative voltage generator (voltage generator) 5, the input interface circuit 10, and the inverted/non-inverted signal generator 11 may be omitted.

Furthermore, although the semiconductor switch 1 is illustratively based on the SPDT switch, a kPlT switch can be constructed likewise, where k, l are natural numbers.

Figure 4:
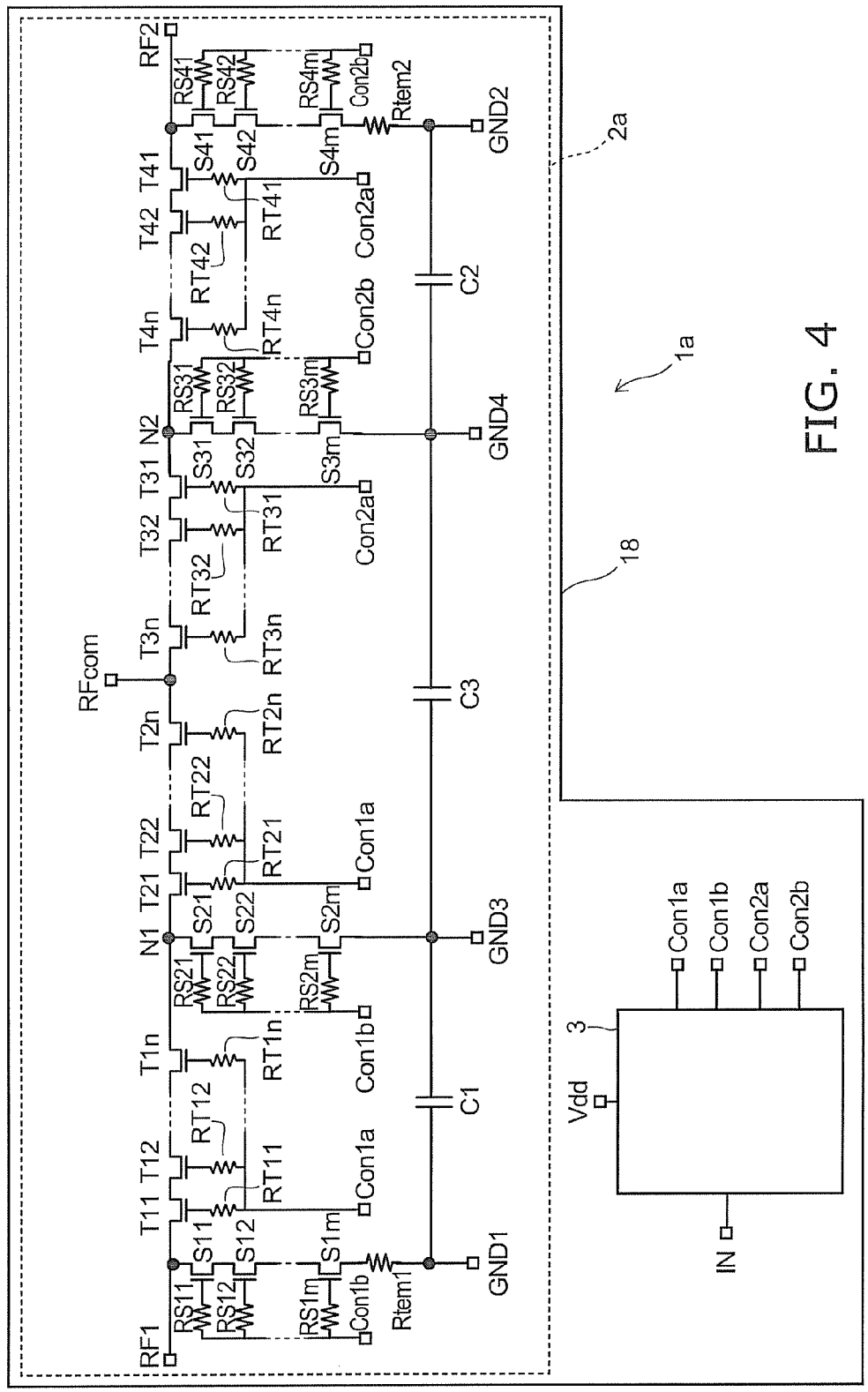
FIG. 4 is a block diagram illustrating the configuration of a semiconductor switch according to the embodiment of the invention.

FIG. 4 is a block diagram illustrating the configuration of a semiconductor switch according to the embodiment of the invention.

As shown in FIG. 4, the semiconductor switch is includes a switch section 2a and a controller section 3. These are formed in the same substrate 18 (semiconductor switch substrate) to provide a one-chip structure. That is, the semiconductor switch is has a configuration in which the switch section 2 of the semiconductor switch 1 shown in FIG. 1 is replaced by the switch section 2a.

The switch section 2a illustratively has a configuration for switching the connection state between a first terminal RFcom and two second terminals RF1, RF2.

The connection state of the switch section 2a is switched by the controller section 3.

The semiconductor switch is an SPDT switch.

As shown in FIG. 4, through FETs T11, T12, . . . , T1n, T22, . . . , T2n, . . . , T41, T42, . . . , T4n, including n stages (n being a natural number), respectively, of first FETs T11, T12, . . . , T1n, T41, T42, . . . , T4n and second FETs T21, T22, . . . , T2n, T31, T32, . . . , T3n, are connected in series between the first terminal RFcom and each of the second terminals RF1, RF2.

The first FETs T11, T12, . . . , T1n and the second FETs T21, T22, . . . , T2n are connected between the first terminal RFcom and the second terminal RF1. The first FETs T41, T42, . . . , T4n and the second FETs T31, T32, . . . , T3n are connected between the first terminal RFcom and the second terminal RF2.

Between a second ground terminal GND3 and the connection node N1 of the first FETs T11, T12, . . . , T1n and the second FETs T21, T22, . . . , T2n, m stages (m being a natural number) of third FETs S21, S22, . . . , S2m are connected in series.

Between a second ground terminal GND4 and the connection node N2 of the first FETs T41, T42, . . . , T4n and the second FETs T31, T32, . . . , T3n, m stages (m being a natural number) of third FETs S31, S32, . . . , S3m are connected in series.

Between each of the second terminals RF1, RF2 and the first ground terminal GND1, GND2, m stages (m being a natural number) of shunt FETs S11, S12, . . . , S1m, S41, S42, . . . , S4m and a resistor Rtem1, Rtem2 are connected in series. The shunt FETs S11, S12, . . . , S1m and the resistor Rtem1 are connected between the second terminal RF1 and the first ground terminal GND1. The shunt FETs S41, S42, . . . , S4m and the resistor Rtem2 are connected between the second terminal RF2 and the first ground terminal GND2.

The gates of the first FETs T11, T12, . . . , T1n connected to the second terminal RF1 are connected to a first control terminal Con1a respectively through resistors RT11, RT12, . . . , RT1n for preventing leakage of radio frequency. The first control terminal Con1a is connected to the controller section 3. The resistors RT11, RT12, . . . , RT1n each have a resistance high enough to avoid leakage of radio frequency signals to the controller section 3.

The gates of the shunt FETs S11, S12, ..., S1m connected to the second terminal RF1 are connected to a second control terminal Con1b respectively through resistors RS11, RS12, ..., RS1m for preventing leakage of radio frequency. The second control terminal Con1b is connected to the controller section 3. The resistors RS11, RS12, ..., RS1m each have a resistance high enough to avoid leakage of radio frequency signals to the controller section 3.

The gates of the second FETs T21, T22, ..., T2n connected between the connection node N1 and the first terminal RFcom are connected to the first control terminal Con1a respectively through resistors RT21, RT22, ..., RT2n for preventing leakage of radio frequency. The resistors RT21, RT22, ..., RT2n each have a resistance high enough to avoid leakage of radio frequency signals to the controller section 3.

The gates of the third FETs S21, S22, ..., S2m connected between the connection node N1 and the second ground terminal GND3 are connected to the second control terminal Con1b respectively through resistors RS21, RS22, ..., RS2m for preventing leakage of radio frequency. The resistors RS21, RS22, ..., RS2m each have a resistance high enough to avoid leakage of radio frequency signals to the controller section 3.

The gates of the first FETs T41, T42, ..., T4n connected to the second terminal RF2 are connected to a first control terminal Con2a respectively through resistors RT41, RT42, ..., RT4n for preventing leakage of radio frequency. The first control terminal Con2a is connected to the controller section 3. The resistors RT41, RT42, ..., RT4n each have a resistance high enough to avoid leakage of radio frequency signals to the controller section 3.

The gates of the shunt FETs S41, S42, ..., S4m connected to the second terminal RF2 are connected to a second control terminal Con2b respectively through resistors RS41, RS42, ..., RS4m for preventing leakage of radio frequency. The second control terminal Con2b is connected to the controller section 3. The resistors RS41, RS42, ..., RS4m each have a resistance high enough to avoid leakage of radio frequency signals to the controller section 3.

The gates of the second FETs T31, T32, ..., T3n connected between the connection node N2 and the first terminal RFcom are connected to the first control terminal Con2a respectively through resistors RT31, RT32, ..., RT3n for preventing leakage of radio frequency. The resistors RT31, RT32, ..., RT3n each have a resistance high enough to avoid leakage of radio frequency signals to the controller section 3.

The gates of the third FETs S31, S32, ..., S3m connected between the connection node N2 and the second ground terminal GND4 are connected to the second control terminal Con2b respectively through resistors RS31, RS32, ..., RS3m for preventing leakage of radio frequency. The resistors RS31, RS32, ..., RS3m each have a resistance high enough to avoid leakage of radio frequency signals to the controller section 3.

During turn-off of the through FETs, or the first and second FETs, connected to the second terminal to which the shunt FET is connected, the shunt FET and the third FET enhance isolation between that second terminal and the first terminal. More specifically, even when the first and second FET are turned off, a radio frequency signal may leak to the second terminal connected to that first FET in the OFF state. At this time, the leaked radio frequency signal can be dissipated to the ground through the shunt FET and the third FET in the ON state and through the first and second ground terminal.

Furthermore, a first capacitor C1 is connected between the first ground terminal GND1 and the second ground terminal GND3. A first capacitor C2 is connected between the first ground terminal GND2 and the second ground terminal GND4. Furthermore, a second capacitor C3 is connected between the second ground terminals GND3 and GND4.

For instance, for conduction between the second terminal RF1 and the first terminal RFcom, the through FETs between the second terminal RF1 and the first terminal RFcom, that is, the n stages of series connected first FETs T11-T1n and second FETs T21-T2n, are turned on. Simultaneously, the m stages of series connected shunt FETs S11-S1m between the second terminal RF1 and the first ground terminal GND1 and the m stages of series connected third FETs S21-S2m between the connection node N1 and the second ground terminal GND3 are turned off. Simultaneously, the through FETs, or the first and second FETs, between the other second terminal RF2 and the first terminal RFcom are all turned off, and the shunt FETs between the other second terminal RF2 and the first ground terminal GND2 and the third FETs between the connection node N2 and the second ground terminal GND4 are all turned on.

In the above case, an ON potential Von is applied to the first control terminal Con1a, and an OFF potential Voff is applied to the second control terminal Con1b. Furthermore, the OFF potential Voff is applied to the first control terminal Con2a, and the ON potential Von is applied to the second control terminal Con2b. The ON potential Von is a gate potential bringing each FET into the conducting state in which its ON resistance has a sufficiently small value. The OFF potential Voff is a gate potential bringing each FET into the blocking state which can be sufficiently maintained even under superposition of a radio frequency signal. The threshold voltage Vth of each FET is illustratively 0.1 V.

If the ON potential Von is lower than a desired potential (such as 2.4 V), the ON resistance of the FET in the conducting state increases, degrading insertion loss, and distortion generated by the FET in the conducting state (ON distortion) increases. If the OFF potential Voff is higher than a desired potential (such as −1.5 V), the maximum allowable input power decreases, and distortion generated by the FET in the blocking state for rated input (OFF distortion) increases.

However, an extremely high ON potential Von or an extremely low OFF potential Voff will exceed the breakdown voltage of the FET. Hence, there is an optimal range for the ON potential Von and the OFF potential Voff. Here, the ON potential Von and the OFF potential Voff are similar to those for the switch section 2 shown in FIG. 1.

When the conducting state is established between the second terminal RF1 and the first terminal RFcom, the impedance seen from the second terminal RF2 toward the switch is the sum of the ON resistance of the shunt FETs S41-S4m and the resistance of the resistor Rtem2. This value is normally set to 75 Ω. Likewise, when the conducting state is established between the second terminal RF2 and the first terminal RFcom, the impedance seen from the second terminal RF1 toward the switch is the sum of the ON resistance of the shunt FETs S11-S1m and the resistance of the resistor Rtem1. This value is normally set to 75 Ω. Here, if the ON resistance of the shunt FETs S11-S1m is set to 75 Ω, the resistor Rtem1 is not needed. This also applies to the resistor Rtem2.

Thus, in the semiconductor switch 1a, the ground terminal of the switch section 2a is split into the first ground terminal GND1, GND2 and the second ground terminal GND3, GND4, and the first and second capacitor C1-C3 are separately provided between the first and second ground terminal GND1-GND4.

As described below, this can suppress isolation degradation due to bonding wire parasitic inductance.

Figure 5:
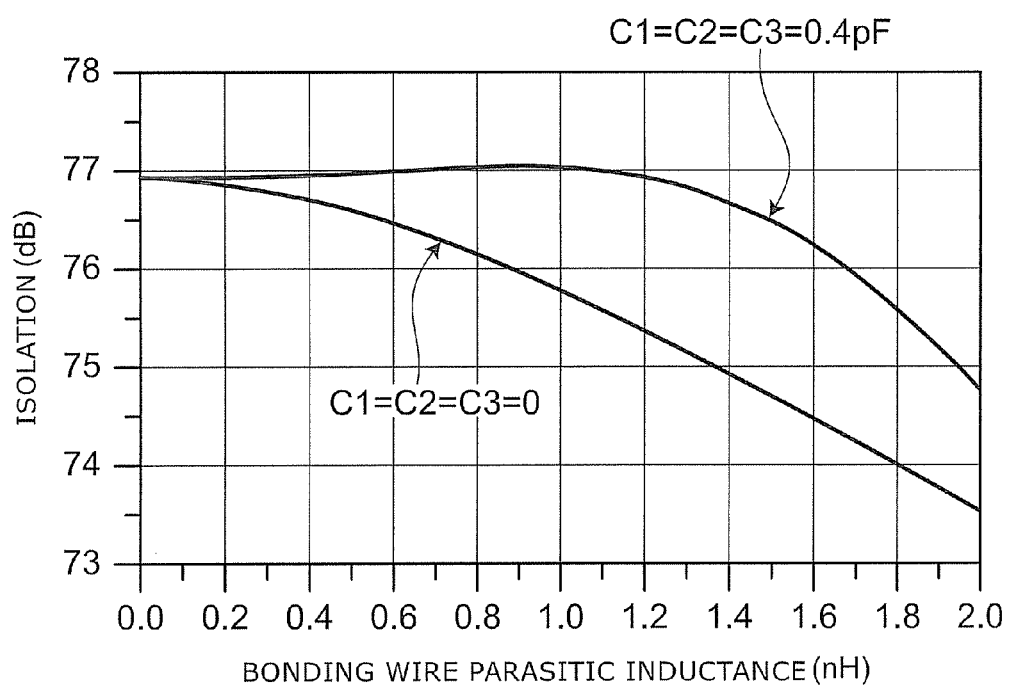
FIG. 5 is a graph of a simulation result for isolation of the semiconductor switch shown in FIG. 4.

FIG. 5 is a graph of a simulation result for isolation of the semiconductor switch shown in FIG. 4.

FIG. 5 shows the relationship between bonding wire parasitic inductance and the isolation between the second terminals RF1, RF2 at a frequency of 1 GHz.

It shows the case where the capacitances of the first capacitors C1, C2 and the second capacitor C3 are all set to 0.4 pF, and the case where they are 0 pF, that is, the first and second capacitor C1, C2, C3 are absent.

As shown in FIG. 5, in the case where the capacitances of the first and second capacitor C1, C2, C3 are 0.4 pF, isolation degradation is completely suppressed even if there is a parasitic inductance of approximately 1 nH.

Furthermore, in the controller section 3, the drivers 4a, 4b are independently provided at the respective second terminals (respective ports). Thus, interference of radio frequency signals superposed on each control signal with other control signals is avoided, and isolation can be improved. Furthermore, because the switch section 2a includes the first and second capacitor C1, C2, C3, isolation degradation due to the effect of parasitic inductance is suppressed, and isolation can be improved.

Thus, the semiconductor switch 1a can improve isolation.

Figure 6:
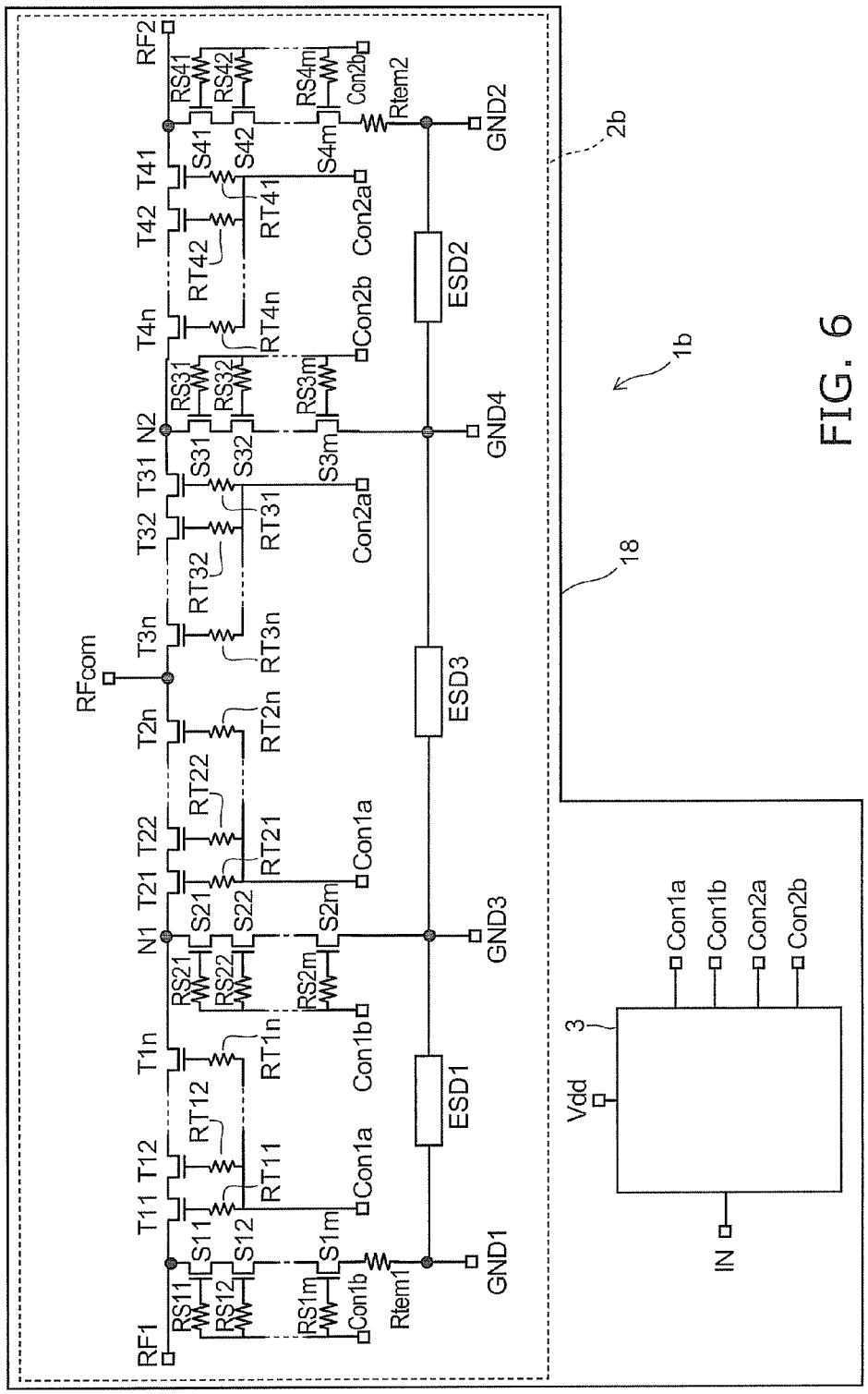
FIG. 6 is a block diagram illustrating the configuration of a semiconductor switch according to the embodiment of the invention.

FIG. 6 is a block diagram illustrating the configuration of a semiconductor switch according to the embodiment of the invention.

As shown in FIG. 6, the semiconductor switch 1b has a configuration in which the switch section 2a shown in FIG. 4 is replaced by a switch section 2b. The switch section 2b is similar to the switch section 2a except that the first and second capacitor C1, C2, C3, of the switch section 2a are replaced by ESD protection elements ESD1, ESD2, ESD3, respectively.

The ESD protection element, such as series connected pn-junction diodes, has a parasitic capacitance of approximately 0.4 pF. Hence, the semiconductor switch 1b achieves an effect similar to that of the semiconductor switch 1a shown in FIG. 4. Furthermore, it has the advantage over the semiconductor switch 1a of enhancing ESD breakdown voltage between ground pads of the first and second ground terminal GND1-GND4.

Here, the controller section 3 is similar to that of the semiconductor switch 1a, and illustratively configured as shown in FIG. 2.

Thus, the semiconductor switch 1b can improve isolation.

Figure 7:
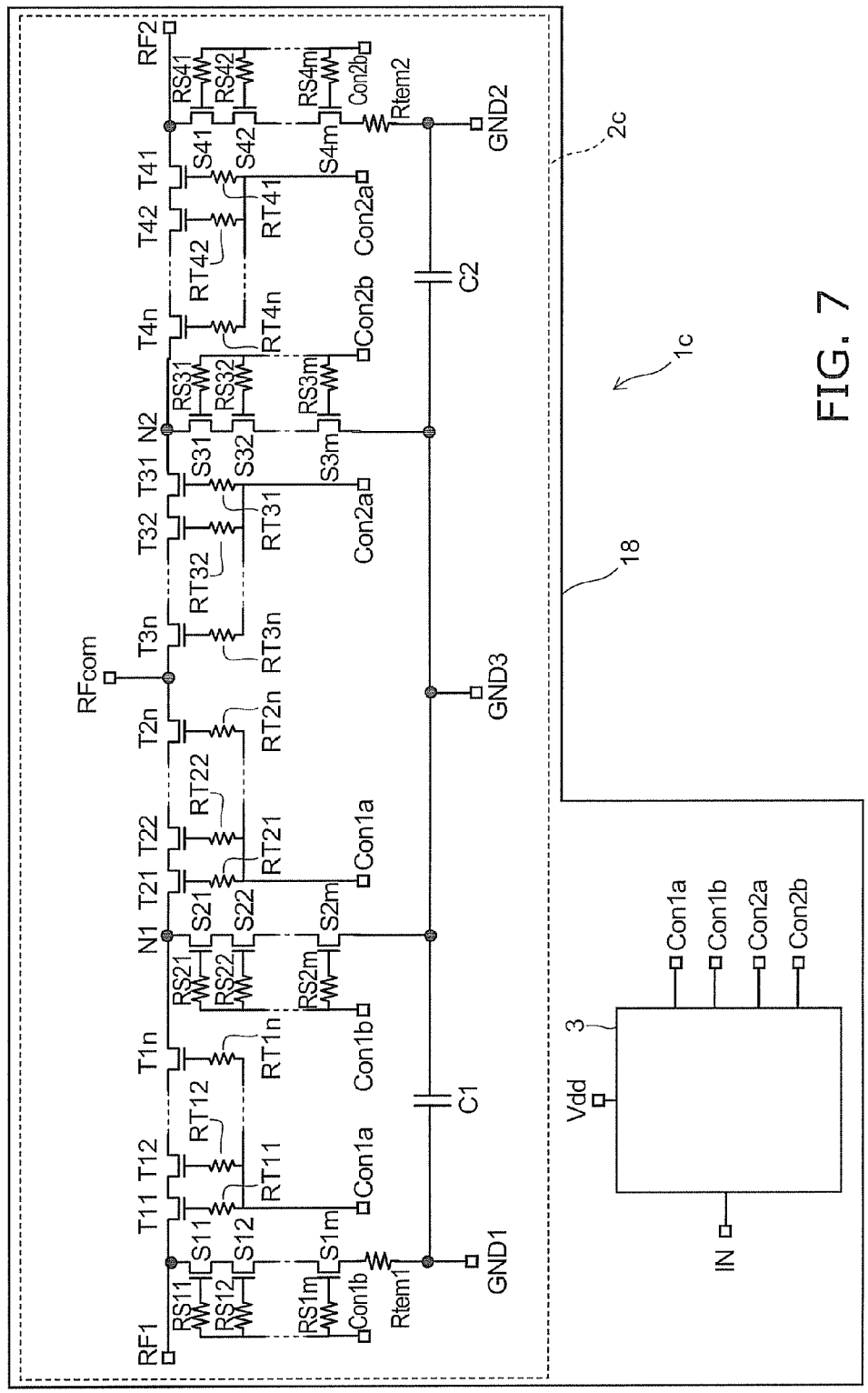
FIG. 7 is a block diagram illustrating the configuration of a semiconductor switch according to the embodiment of the invention.

FIG. 7 is a block diagram illustrating the configuration of a semiconductor switch according to the embodiment of the invention.

As shown in FIG. 7, the semiconductor switch 1c has a configuration in which the switch section 2a shown in FIG. 4 is replaced by a switch section 2c. The switch section 2c has a configuration in which the second ground terminals GND3, GND4 of the switch section 2a are connected to each other. That is, the semiconductor switch 1c is similar to the semiconductor switch 1a shown in FIG. 4 except that the second capacitor C3 is short-circuited.

A common, second ground terminal GND3 is used as the ground of the third FETs S21-S2m, S31-S3m connected to the connection nodes N1 and N2. The first ground terminals GND1, GND2 are split as in the semiconductor switch 1a shown in FIG. 5. Furthermore, first capacitors C1, C2 are provided, respectively, between the first ground terminal GND1 and the second ground terminal GND3 and between the first ground terminal GND2 and the second ground terminal GND3.

This configuration can suppress isolation degradation due to bonding wire parasitic inductance.

Figure 8:
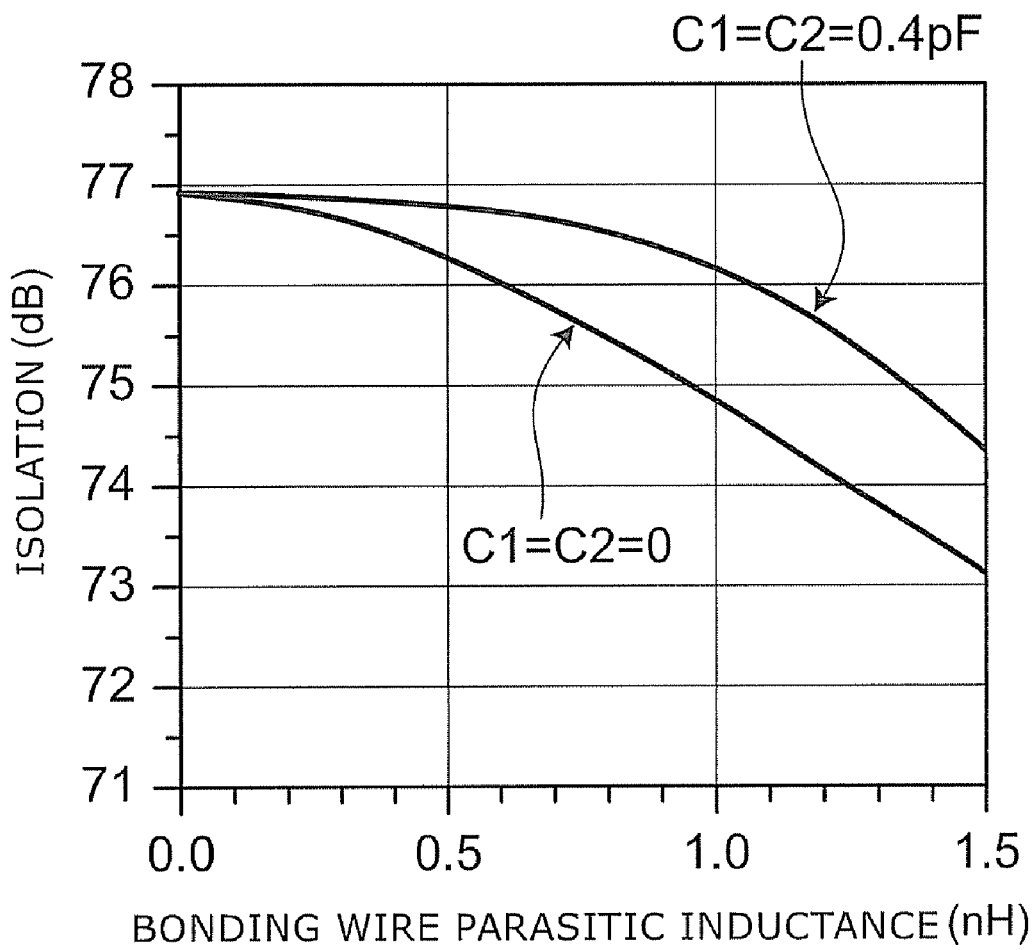
FIG. 8 is a graph of a simulation result for isolation of the semiconductor switch based on the switch section shown in FIG. 7.

FIG. 8 is a graph of a simulation result for isolation of the semiconductor switch based on the switch section shown in FIG. 7.

FIG. 8 shows the relationship between bonding wire parasitic inductance and the isolation between the second terminals RF1, RF2 at a frequency of 1 GHz.

It shows the case where the capacitances of the first capacitors C1, C2 are all set to 0.4 pF, and the case where they are 0 pF, that is, the first capacitors C1, C2 are absent.

As shown in FIG. 8, in the case where the capacitances of the first capacitors C1, C2 are 0.4 pF, isolation degradation due to parasitic inductance is suppressed.

Although the effect of suppressing isolation degradation is slightly inferior to that of the semiconductor switch is shown in FIG. 4, an advantage over the semiconductor switch 1a is that the number of ground terminals of the switch section 2c is reduced to three.

Thus, the semiconductor switch is can suppress isolation degradation due to the effect of parasitic inductance by bonding wires.

Here, the controller section 3 is similar to that of the semiconductor switch 1a, and illustratively configured as shown in FIG. 2.

Thus, the semiconductor switch 1c can improve isolation.

Figure 9:
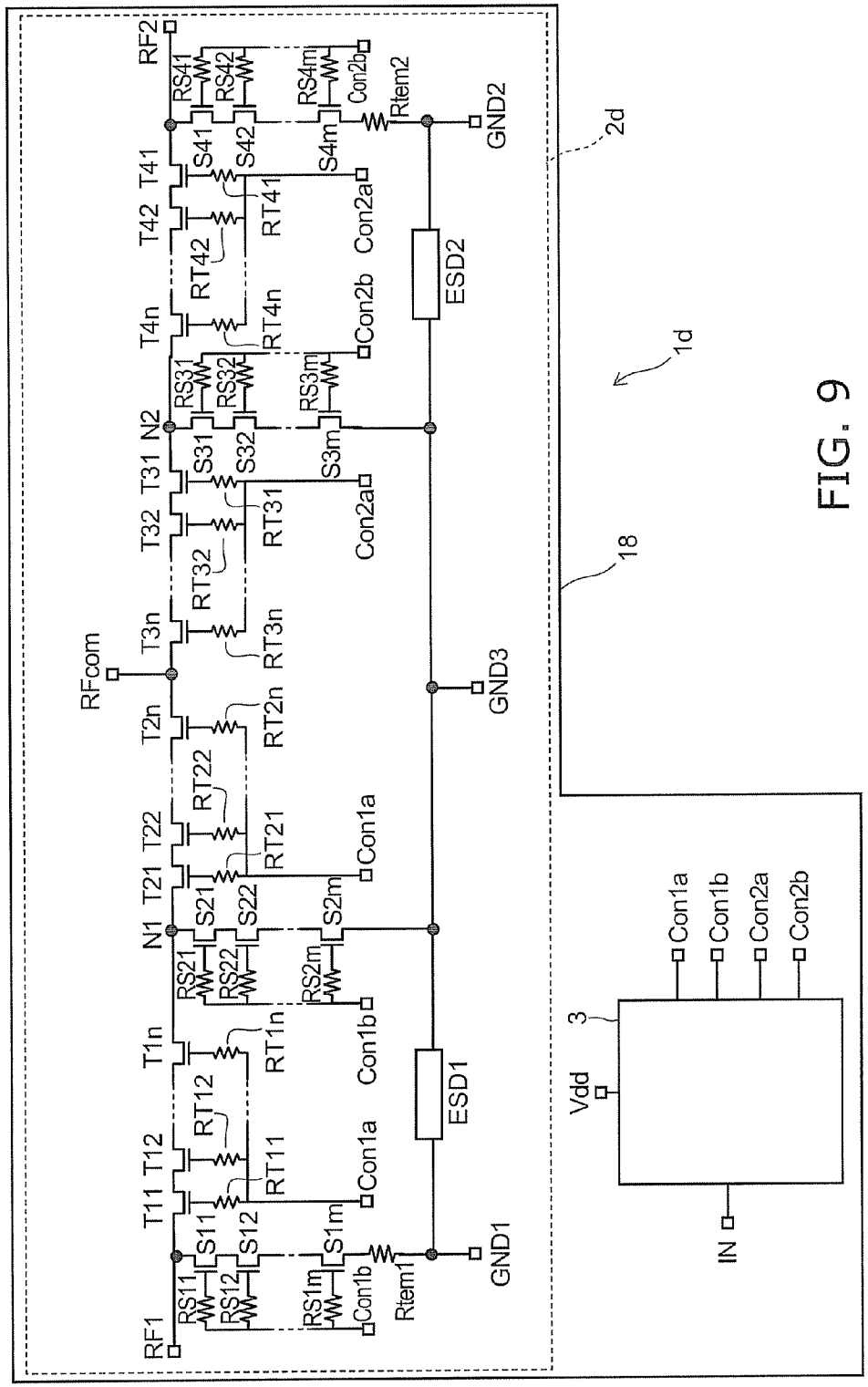
FIG. 9 is a block diagram illustrating the configuration of a semiconductor switch according to the embodiment of the invention.

FIG. 9 is a block diagram illustrating the configuration of a semiconductor switch according to the embodiment of the invention.

As shown in FIG. 9, the semiconductor switch 1d has a configuration in which the switch section 2c shown in FIG. 7 is replaced by a switch section 2d. The switch section 2d is similar to the switch section 2c except that the first capacitors C1, C2 of the switch section 2c are replaced by ESD protection elements ESD1, ESD2, respectively.

As described with reference to FIG. 6, the ESD protection element has a parasitic capacitance of approximately 0.4 pF. Hence, the semiconductor switch 1d achieves an effect similar to that of the semiconductor switch 1c shown in FIG. 7. Furthermore, it has the advantage over the semiconductor switch is of enhancing ESD breakdown voltage between ground pads of the first and second ground terminal GND1-GND3.

The semiconductor switch 1d can suppress isolation degradation due to the effect of parasitic inductance by bonding wires.

Here, the controller section 3 is similar to that of the semiconductor switch 1a, and illustratively configured as shown in FIG. 2.

Thus, the semiconductor switch 1d can improve isolation.

Figure 10:
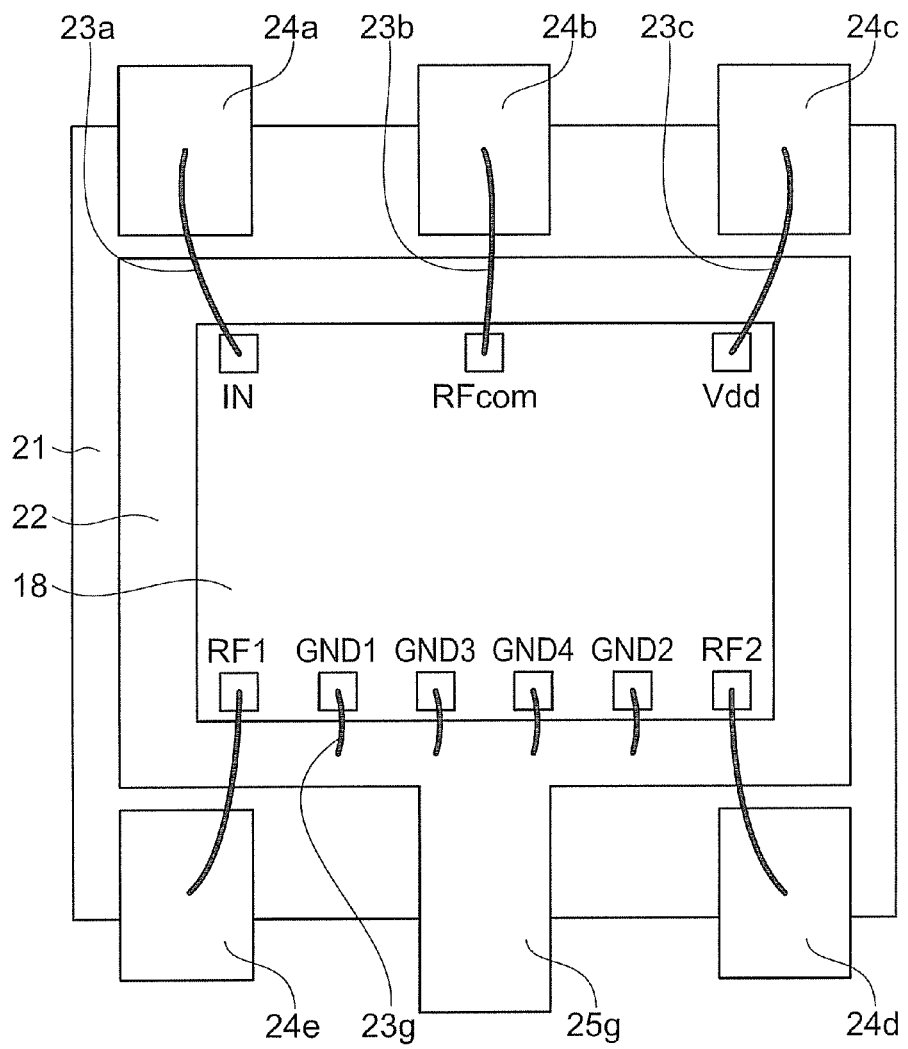
FIG. 10 is a schematic view illustrating the configuration of the semiconductor switch according to the embodiment of the invention.

FIG. 10 is a schematic view illustrating the configuration of the semiconductor switch according to the embodiment of the invention.

FIG. 10 schematically shows the state in which the semiconductor switch substrate 18 is mounted on a package 21. The semiconductor switch 1a shown in FIG. 4 is illustratively provided on the semiconductor switch substrate 18.

As shown in FIG. 10, the semiconductor switch substrate 18 is placed on the bed 22 of the package 21.

The semiconductor switch substrate 18 has a rectangular planar shape having four sides. Along one side are placed pads (a control pad, a first pad, and a supply pad) for connecting the external control terminal IN, the first terminal RFcom, and the power supply terminal (power supply voltage Vdd) to leads 24a, 24b, 24c of the package 21, respectively. The pads (the control pad, the first pad, and the supply pad) are bonded to the leads 24a-24c by bonding wires 23a-23c, respectively.

It is noted that in FIG. 10, the pads (the control pad, the first pad, and the supply pad) are labeled with the same reference numerals as the corresponding terminals.

Ground pads of the first ground terminal GND1, the second ground terminal GND3, the second ground terminal GND4, and the first ground terminal GND2 are juxtaposed along another side opposed to the side where the first pad of the first terminal RFcom is located. Furthermore, second pads of the second terminals RF1, RF2 are provided on both sides next to the first and second ground terminals GND1-GND4.

Furthermore, the ground pad of the first ground terminal GND1 is bonded to the bed 22 of the package 21 by a bonding wire 23g. Likewise, each ground pad of the first and second ground terminal GND2-4 is bonded to the bed 22. Thus, no ESD breakdown occurs in the capacitor element between the first ground terminal GND1 and the second ground terminal GND3, the capacitor element between the second ground terminals GND3, GND4, and the capacitor element between the second ground terminal GND4 and the first ground terminal GND2.

Furthermore, the second pads of the second terminals RF1, RF2 are separately bonded to leads 24d, 24e.

Such placement of the first pad, the ground pads, and second pads on the semiconductor switch substrate 18 can prevent isolation degradation due to packaging.

Although the parasitic inductance existing in the grounding lead 25g of the package 21 tends to degrade isolation, the degradation can be suppressed by suitably setting the value of the first and second capacitor C1, C2, C3.

Figure 11:
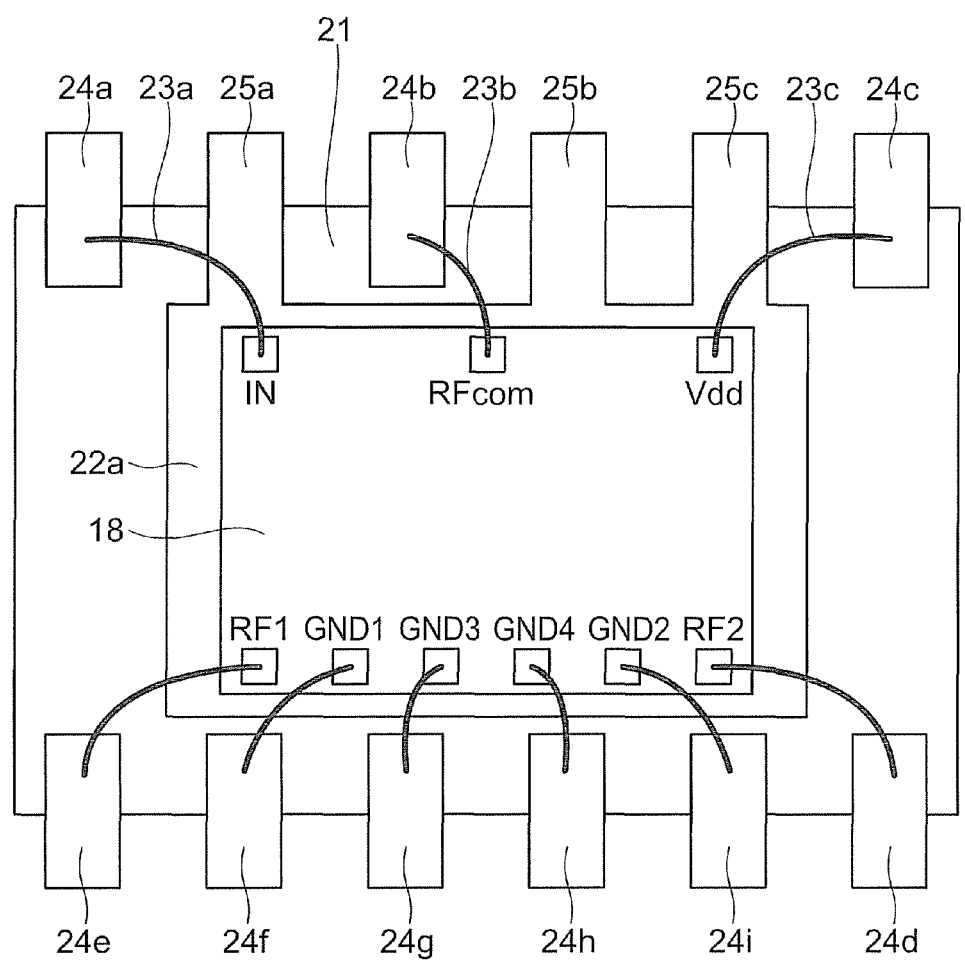
FIG. 11 is a schematic view illustrating the configuration of the semiconductor switch according to the embodiment of the invention.

FIG. 11 is a schematic view illustrating the configuration of the semiconductor switch according to the embodiment of the invention.

FIG. 11 schematically shows the state in which the semiconductor switch substrate 18 is mounted on a package 21. The semiconductor switch 1b shown in FIG. 6 is illustratively provided on the semiconductor switch substrate 18.

As shown in FIG. 11, the semiconductor switch substrate 18 is placed on the bed 22a of the package 21.

In the planar configuration of the bed 22a, grounding leads 25a, 25b, 25c are provided between the lead 24a and the lead 24b, and between the lead 24b and the lead 24c. Furthermore, the grounding lead 25g between the lead 24e and the lead 24d in the bed 22 does not exist, but the package 21 separately includes leads 24f-24i. Ground pads of the first and second ground terminal GND1-GND4 are separately bonded to the leads 24f-24i. The rest is similar to the bed 22 of the package 21 shown in FIG. 10.

Pads (a control pad, a first pad, and a supply pad) of the external control terminal IN, the first terminal RFcom, and the power supply terminal (supply voltage Vdd) are placed along one side of the semiconductor switch substrate 18. A second pad of the second terminal RF1, ground pads of the first and second ground terminals GND1-GND4, and a second pad of the second terminal RF2 are placed along another side opposed to the side where the first pad of the first terminal RFcom is located.

Because the ground pads of the first and second ground terminals GND1-GND4 are separately connected to the different leads 24f-24i of the package 21, no isolation degradation occurs due to the parasitic inductance of the leads. Furthermore, ESD protection elements ESD1-ESD3 are separately provided between the first ground terminal GND1 and the second ground terminal GND3, between the second ground terminals GND3 and GND4, and between the second ground terminal GND4 and the first ground terminal GND2. Hence, no ESD breakdown occurs even if high voltage is applied between the ground terminals, that is, the leads 24f-24i.

Such placement of the first pad, the ground pads, and the second pads can prevent isolation degradation due to packaging.

Although the foregoing has described the case where the semiconductor switch 1b is mounted on the bed 22a of the package 21, the semiconductor switch 1d can be mounted likewise.

Figure 12:
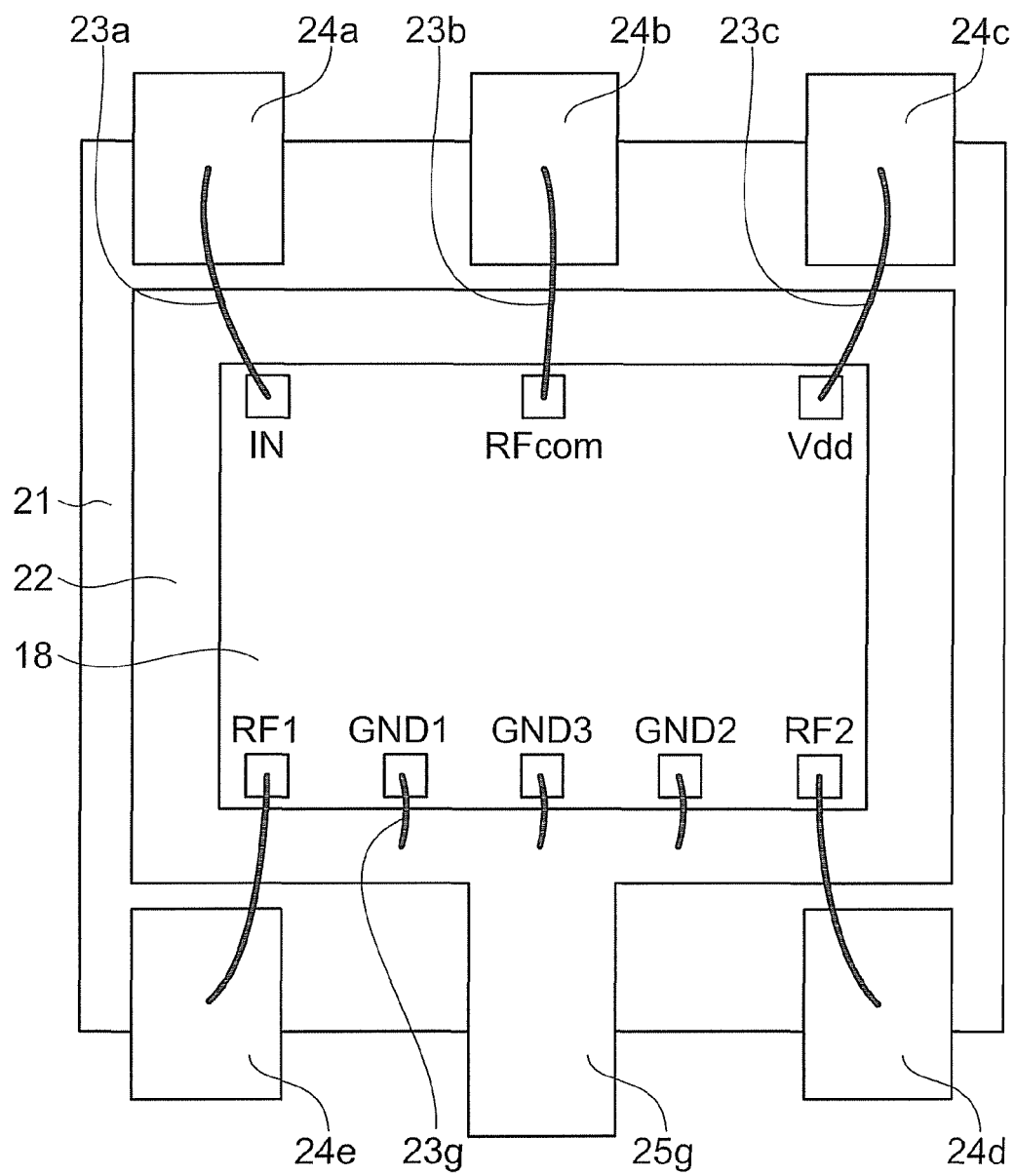
FIG. 12 is a schematic view illustrating the configuration of the semiconductor switch according to the embodiment of the invention.

FIG. 12 is a schematic view illustrating the configuration of the semiconductor switch according to the embodiment of the invention.

FIG. 12 schematically shows the state in which the semiconductor switch substrate 18 is mounted on a package 21. The semiconductor switch 1c shown in FIG. 7 is illustratively provided on the semiconductor switch substrate 18. That is, in this configuration, the semiconductor switch 1a is replaced by the semiconductor switch 1c.

The semiconductor switch substrate 18 has a rectangular planar shape having four sides. Along one side are placed pads (a control pad, a first pad, and a supply pad) for connecting the external control terminal IN, the first terminal RFcom, and the power supply terminal (supply voltage Vdd) to leads 24a, 24b, 24c of the package 21, respectively. The pads (the control pad, the first pad, and the supply pad) are bonded to the leads 24a-24c by bonding wires 23a-23c, respectively.

Ground pads of the first ground terminal GND1, the second ground terminal GND3, and the first ground terminal GND2 are juxtaposed along another side opposed to the side where the first pad of the first terminal RFcom is located. Furthermore, second pads of the second terminals RF1, RF2 are provided on both sides next to the first and second ground terminals GND1-GND3.

Furthermore, the ground pad of the first ground terminal GND1 is bonded to the bed 22 of the package 21 by a bonding wire 23g. Likewise, each ground pad of the first and second ground terminal GND2-3 is bonded to the bed 22. Thus, no ESD breakdown occurs in the capacitor element between the first ground terminal GND1 and the second ground terminal GND3, and the capacitor element between the second ground terminal GND3 and the first ground terminal GND2.

Furthermore, the second pads of the second terminals RF1, RF2 are separately bonded to leads 24d, 24e.

Such placement of the first pad, the ground pads, and the second pads on the semiconductor switch substrate 18 can prevent isolation degradation due to packaging.

Although the parasitic inductance existing in the grounding lead 25g of the package 21 tends to degrade isolation, the degradation can be suppressed by suitably setting the value of the first capacitors C1, C2.

Figure 13:
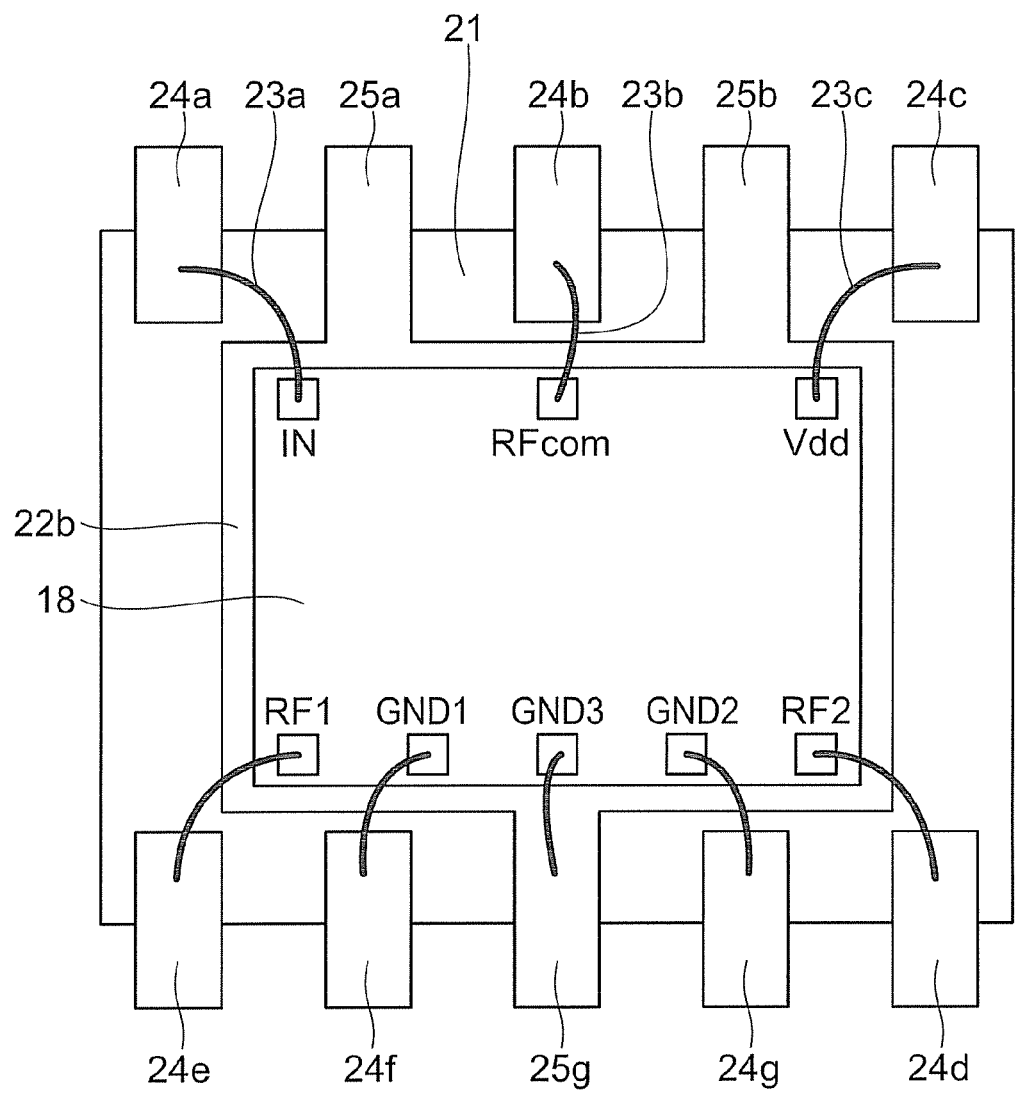
FIG. 13 is a schematic view illustrating the configuration of the semiconductor switch according to the embodiment of the invention.

FIG. 13 is a schematic view illustrating the configuration of the semiconductor switch according to the embodiment of the invention.

FIG. 13 schematically shows the state in which the semiconductor switch substrate 18 is mounted on a package 21. The semiconductor switch 1d shown in FIG. 9 is illustratively provided on the semiconductor switch substrate 18.

As shown in FIG. 13, the semiconductor switch substrate 18 is placed on the bed 22b of the package 21.

In the planar configuration of the bed 22b, grounding leads 25a, 25b are provided between the lead 24a and the lead 24b, and between the lead 24b and the lead 24c, respectively. Furthermore, besides the grounding lead 25g between the lead 24e and the lead 24d in the bed 22, the package 21 additionally includes leads 24f, 24g. Ground pads of the first and second ground terminal GND1-GND3 are separately bonded to the lead 24f, the grounding lead 25g, and the lead 24g. The rest is similar to the bed 22 of the package 21 shown in FIG. 10.

The ground pads of the first and second ground terminal GND1-GND3 are juxtaposed along another side opposed to the side where a first pad of the first terminal RFcom of the semiconductor switch substrate 18 is located. Furthermore, second pads of the second terminals RF1, RF2 are provided on both sides next to them. Such placement of the first pad, the ground pads, and the second pads can prevent isolation degradation due to packaging.

Because the ground pads of the first ground terminals GND1, GND2 are connected to the separate leads 24f, 24g of the package 21, respectively, no isolation degradation occurs due to the parasitic inductance of the leads. Furthermore, ESD protection elements ESD1, ESD2 are provided, respectively, between the first ground terminal GND1 and the second ground terminal GND3, and between the second ground terminal GND3 and the first ground terminal GND2. Hence, no ESD breakdown occurs even if high voltage is applied between the ground terminals, that is, between the lead 24f, the grounding lead 25g, and the lead 24g.

Although the foregoing has described the case where the semiconductor switch 1d is mounted on the bed 22b of the package 21, the semiconductor switch 1b can be mounted likewise.

Returning again to FIG. 2, in the semiconductor switch 1, the controller section 3 includes two drivers 4a, 4b.

Thus, by providing the drivers 4a, 4b independently at the respective second terminals (respective ports), interference of radio frequency signals superposed on each control signal with other control signals is avoided. Hence, isolation is improved.

Figure 14:
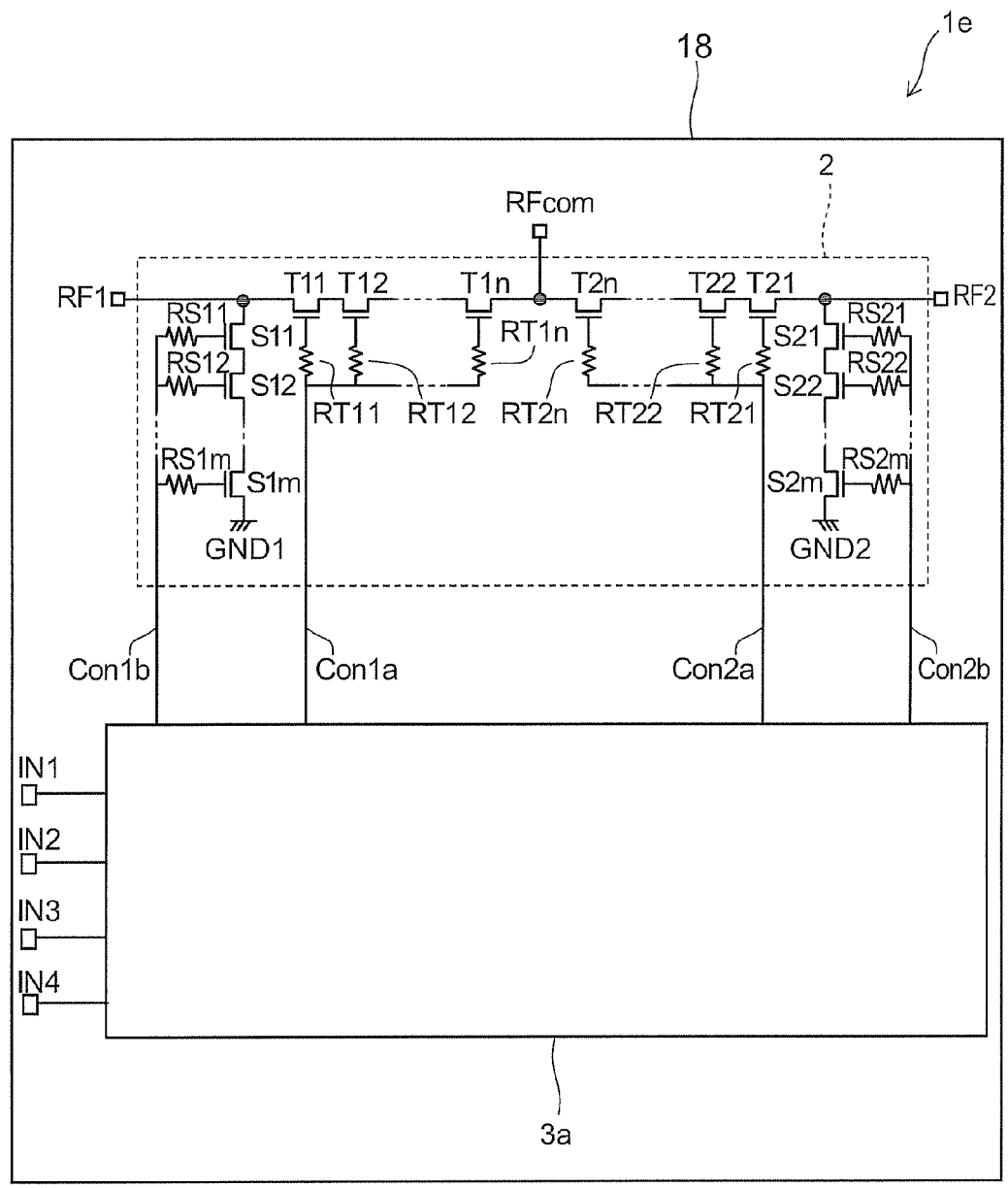
FIG. 14 is a circuit diagram illustrating the configuration of a semiconductor switch according to the embodiment of the invention.

FIG. 14 is a circuit diagram illustrating the configuration of a semiconductor switch according to the embodiment of the invention.

As shown in FIG. 14, the semiconductor switch 1e includes a switch section 2 and a controller section 3a. These are formed in the same substrate 18 (semiconductor switch substrate) to provide a one-chip structure.

The semiconductor switch 1e has a configuration in which the controller section 3 of the semiconductor switch 1 shown in FIG. 1 is replaced by the controller section 3a.

The controller section 3a switches the connection state of the switch section 2. It is noted that the controller section 3a may be part of a circuit for controlling the switch section 2.

In the controller section 3a, the first control terminal Con1a, the second control terminal Con1b, the first control terminal Con2a, and the second control terminal Con2b are independently driven by inputs at external control terminals IN1-IN4.

As an illustrative configuration, four drivers, not shown, can be provided so that signals inputted to the external control terminals IN1-IN4 are each level-shifted to independently drive the first and second control terminals Con1a-Con2b.

Hence, isolation can be improved.

Furthermore, the semiconductor switch 1e allows a total of 16 types of switching because the first and second control terminals Con1a-Con2b can be driven independently.

That is, a total of 16 types of switching can be implemented by providing a binary value of high level or low level independently to the external control terminals IN1-IN4.

For instance, the through FETs T11, T12, ..., T1n connected to the second terminal RF1 and the through FETs T21, T22, ..., T2n connected to the second terminal RF2 are both turned off. Simultaneously, the shunt FETs S11, S12, ..., S1m connected to the second terminal RF1 and the shunt FETs S21, S22, ..., S2m connected to the second terminal RF2 can both be turned on, for instance.

Figure 15:
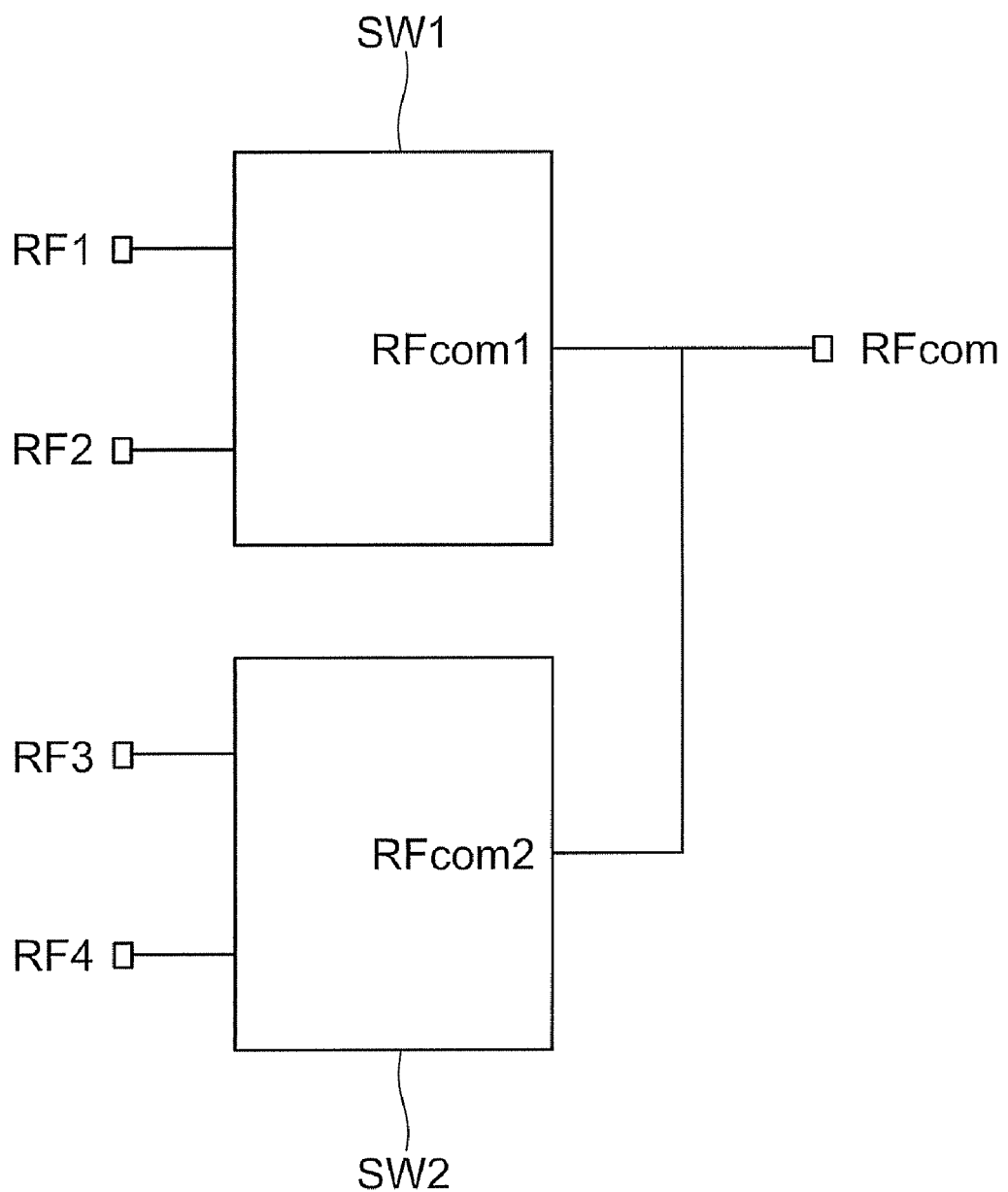
FIG. 15 is a circuit diagram illustrating the configuration of semiconductor switches of a practical example.

If such states are possible, then as shown in FIG. 15, for instance, an SP4T switch can be constructed by juxtaposing two SPDT switches SW1, SW2. Here, the SPDT switches SW1, SW2 can each be based on the semiconductor switch 1e.

As shown in FIG. 15, the first terminal RFcom1 of the SPDT switch SW1 and the first terminal RFcom2 of the SPDT switch SW2 are connected to the common terminal RFcom of the SP4T switch. The second terminals RF1, RF2 of the SPDT switch SW1 and the second terminals RF3, RF4 of the SPDT switch SW2 each serve as a radio frequency terminal of the SP4T switch.

For instance, for conduction between the second terminal RF1 and the common terminal RFcom, the conducting state is established between the second terminal RF1 and the first terminal RFcom1 in the SPDT switch SW1. Simultaneously, two through FETs connected to the second terminals RF3, RF4 of the SPDT switch SW2 are both turned off.

Here, in such a configuration for independently driving all the first and second control terminals Con1a-Con2b, the number of external control terminals IN1-IN4 increases. Even an SPDT like the semiconductor switch 1e requires four, and the number exponentially increases with the increase of the number of first and second terminals.

Figure 16:
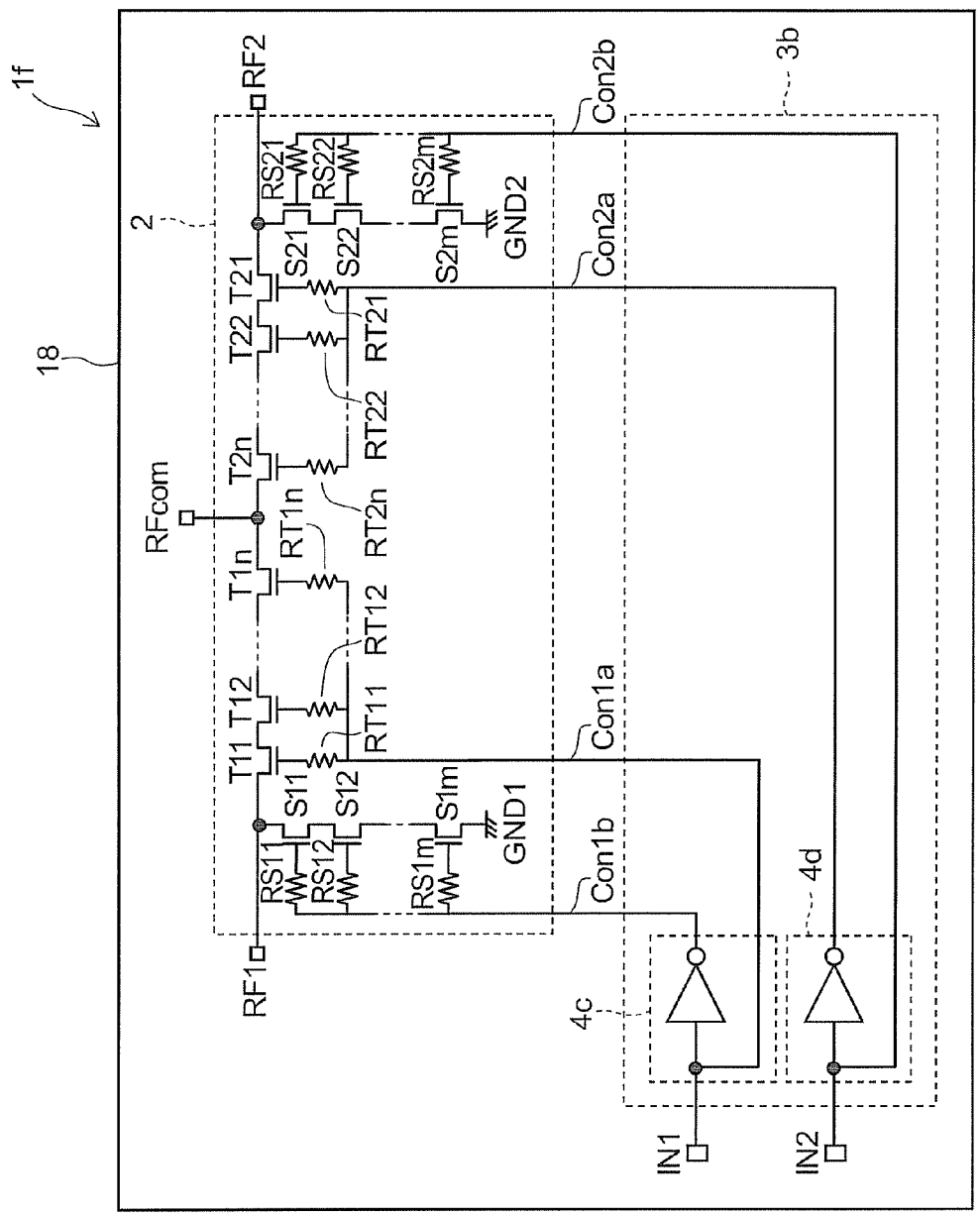
FIG. 16 is a block diagram illustrating the configuration of a semiconductor switch according to the embodiment of the invention.

FIG. 16 is a block diagram illustrating the configuration of a semiconductor switch according to the embodiment of the invention.

As shown in FIG. 16, the semiconductor switch 1f includes a switch section 2 and a controller section 3b. These are formed in the same substrate 18 (semiconductor switch substrate) to provide a one-chip structure.

The semiconductor switch 1f has a configuration in which the controller section 3 of the semiconductor switch 1 shown in FIG. 1 is replaced by the controller section 3b.

The controller section 3b switches the connection state of the switch section 2. It is noted that the controller section 3b may be part of a circuit for controlling the switch section 2.

In the controller section 3b, the first control terminal Con1a is driven by an input at an external control terminal IN1. Simultaneously, the second control terminal Con1b is driven by the inverted signal of the signal inputted to the external control terminal IN1. Furthermore, the first control terminal Con2a is driven by an input at an external control terminal IN2. Simultaneously, the second control terminal Con2b is driven by the inverted signal of the signal inputted to the external control terminal IN2.

That is, in the semiconductor switch 1f, isolation degradation is suppressed by providing drivers 4c, 4d at the second terminals RF1, RF2, respectively. Furthermore, the number of external control terminals required is reduced to the number of second terminals. It is noted that FIG. 16 does not show the input interface circuit for matching the signal level between the external control terminal IN1, IN2 and the driver 4c, 4d.

The semiconductor switch 1f can establish the following four states in the switch section 2.

The first state corresponds to IN1=high level and IN2=low level, establishing the conducting state between the second terminal RF1 and the first terminal RFcom, and the blocking state between the second terminal RF2 and the first terminal RFcom.

The second state corresponds to IN1=low level and IN2=high level, establishing the blocking state between the second terminal RF1 and the first terminal RFcom, and the conducting state between the second terminal RF2 and the first terminal RFcom.

The third state corresponds to IN1=low level and IN2=low level, establishing the blocking state both between the second terminal RF1 and the first terminal RFcom, and between the second terminal RF2 and the first terminal RFcom.

The fourth state corresponds to IN1=high level and IN2=high level, establishing the conducting state both between the second terminal RF1 and the first terminal RFcom, and between the second terminal RF2 and the first terminal RFcom.

In the foregoing, the first and second states are the two states of the SPDT switch shown in FIG. 1.

The third state is the state in which the impedance seen from the first terminal RFcom toward the switch is high. Hence, it is required in such cases where the semiconductor switch 1f is wire-connected to the first terminal RFcom of another switch.

The fourth state implements the conducting state among all the radio frequency terminals, including the second terminals RF1, RF2, and the first terminal RFcom.

Thus, the semiconductor switch 1f can suppress isolation degradation. Furthermore, a multifunctional switch can be constructed with a small number of external control terminals.

Figure 17:
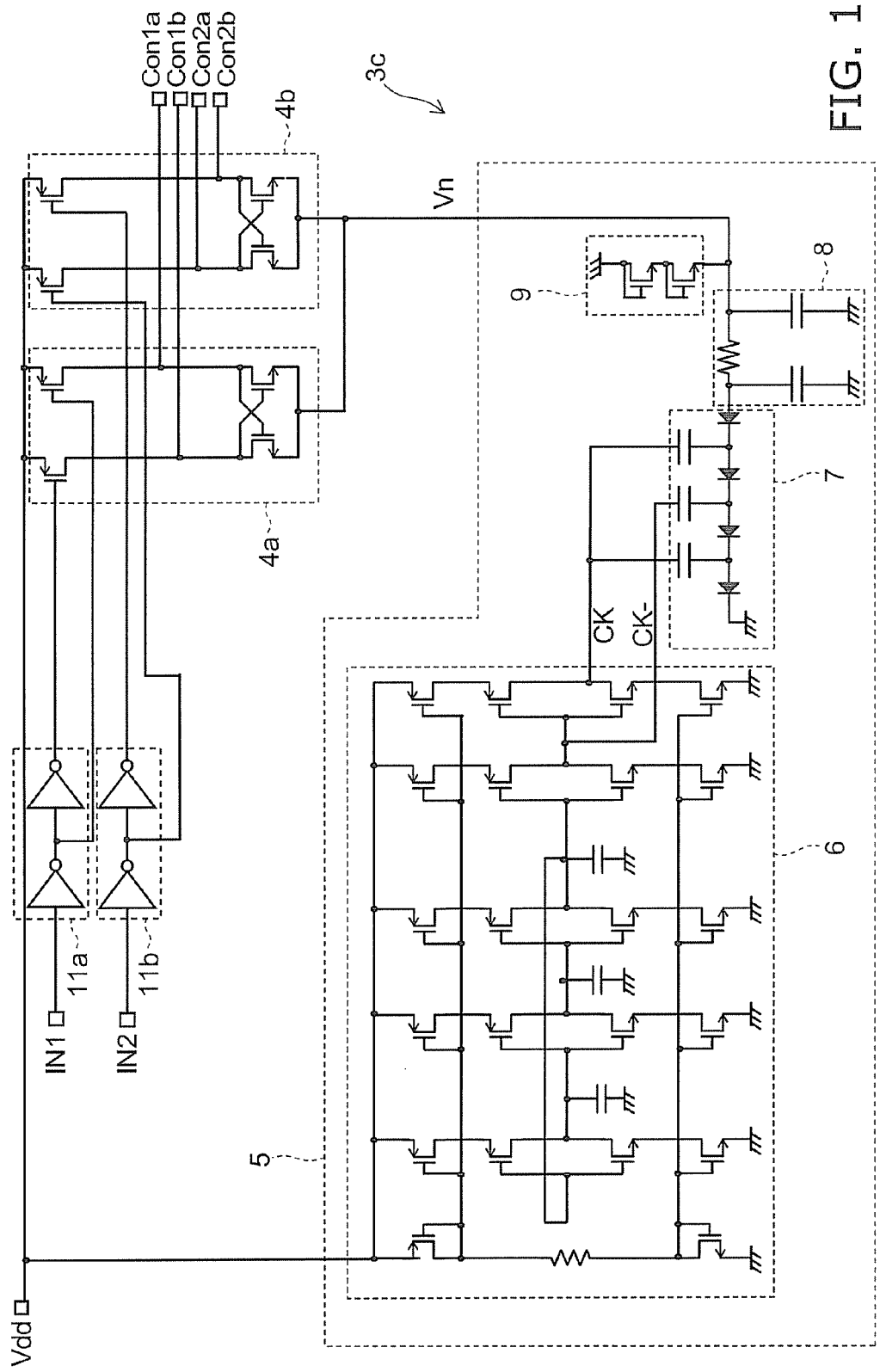
FIG. 17 is a circuit diagram illustrating the configuration of the controller section of the semiconductor switch if shown in FIG. 16.

FIG. 17 is a circuit diagram illustrating the configuration of the controller section of the semiconductor switch 1f shown in FIG. 16.

As shown in FIG. 17, the controller section 3c has a configuration including two inverted/non-inverted signal generators 11a, 11b, which produce outputs to level shifters 4a, 4b, respectively. The rest is similar to the controller section 3 shown in FIG. 2. It is noted that the input interface circuit is not shown.

As shown in FIG. 17, the signal inputted to the external control terminal IN1 is differentially inputted to the driver 4a through the inverted/non-inverted signal generator 11a. The driver 4a drives the first and second control terminal Con1a, Con1b of the through FETs and shunt FETs connected to the second terminal RF1.

The signal inputted to the external control terminal IN2 is differentially inputted to the driver 4b through the inverted/non-inverted signal generator 11b. The driver 4b drives the first and second control terminal Con2a, Con2b of the through FETs and shunt FETs connected to the second terminal RF2.

The number of external control terminals can be further reduced by using multi-valued logic for the input signal to the external control terminal.

Figure 18:
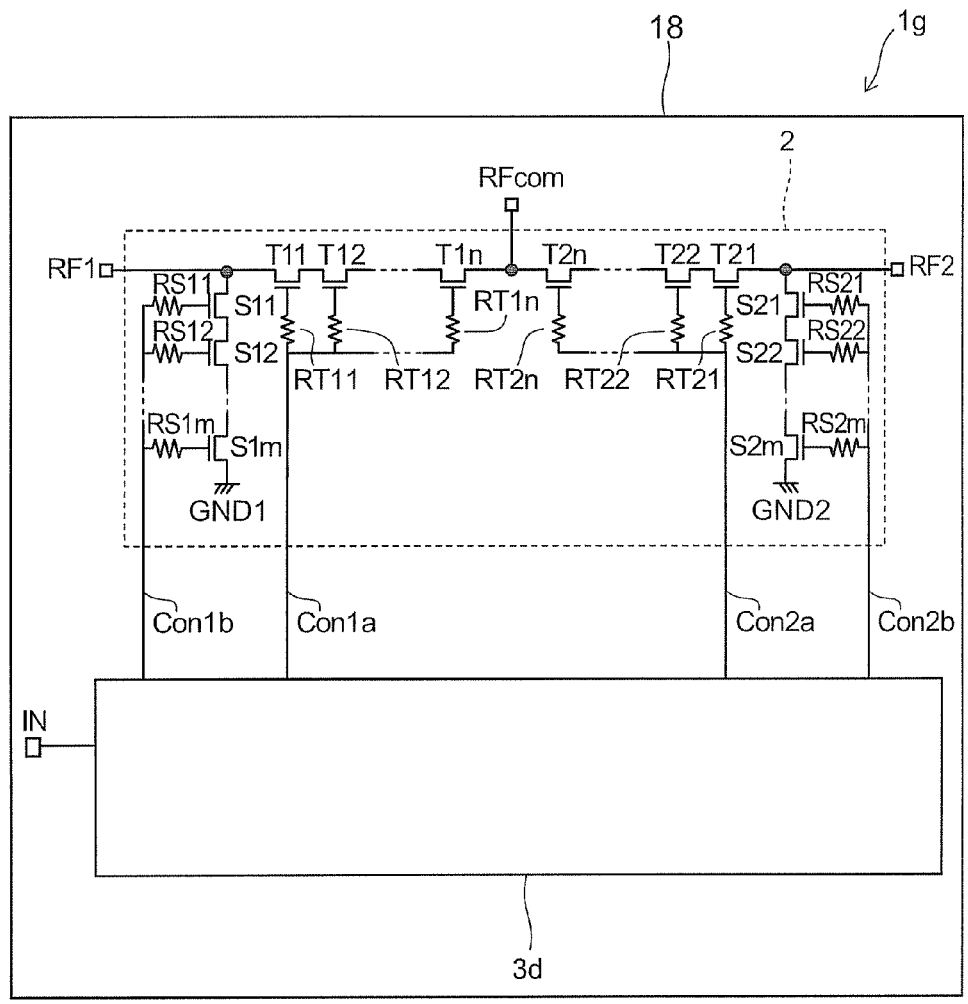
FIG. 18 is a block diagram illustrating the configuration of a semiconductor switch according to the embodiment of the invention.

FIG. 18 is a block diagram illustrating the configuration of a semiconductor switch according to the embodiment of the invention.

As shown in FIG. 18, the semiconductor switch 1g includes a switch section 2 and a controller section 3d. These are formed in the same substrate 18 (semiconductor switch substrate) to provide a one-chip structure.

The semiconductor switch 1g has a configuration in which the controller section 3 of the semiconductor switch 1 shown in FIG. 1 is replaced by the controller section 3d.

In the controller section 3d, a three-valued logic signal is inputted to the external control terminal IN. The first and second control terminals Con1a-Con2b are driven by the controller section 3d in accordance with the signal inputted to the external control terminal IN.

The controller section 3d includes, separately, a driver for driving the first control terminal Con1a and the second control terminal Con1b, and a driver for driving the first control terminal Con2a and the second control terminal Con2b.

The following three states can be implemented.

The first state establishes the conducting state between the second terminal RF1 and the first terminal RFcom, and the blocking state between the second terminal RF2 and the first terminal RFcom.

The second state establishes the conducting state between the second terminal RF2 and the first terminal RFcom, and the blocking state between the second terminal RF1 and the first terminal RFcom.

The third state is other than the above first and second state, and can be designed as needed. For instance, it is the state of conducting both between the second terminal RF1 and the first terminal RFcom, and between the second terminal RF2 and the first terminal RFcom, or the state of blocking both between the second terminal RF1 and the first terminal RFcom, and between the second terminal RF2 and the first terminal RFcom.

The semiconductor switch 1g can improve isolation.

Furthermore, a multifunctional switch can be constructed with a small number of external control terminals.

Figure 19:
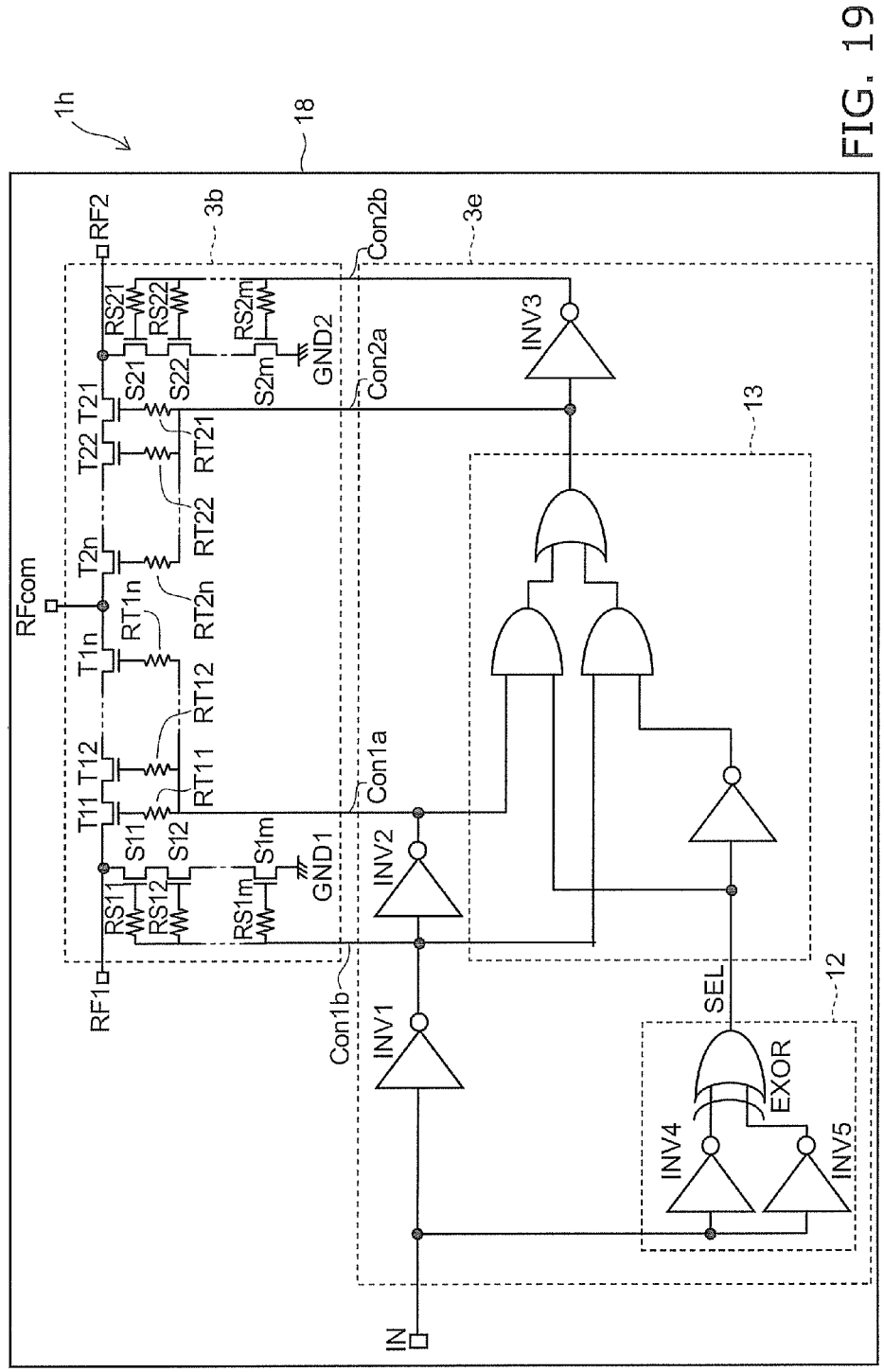
FIG. 19 is a block diagram illustrating the configuration of a semiconductor switch according to the embodiment of the invention.

FIG. 19 is a block diagram illustrating the configuration of a semiconductor switch according to the embodiment of the invention.

As shown in FIG. 19, the semiconductor switch 1h includes a switch section 2 and a controller section 3e. These are formed in the same substrate 18 (semiconductor switch substrate) to provide a one-chip structure.

The semiconductor switch 1h has a configuration in which the controller section 3d of the semiconductor switch 1g shown in FIG. 18 is replaced by the controller section 3e.

The controller section 3e is an example of the controller section 3d.

The signal inputted to the external control terminal IN can assume three values of low level, intermediate level, and high level, where the low level ranges from 0 to V1,
the intermediate level ranges from V1 to V2, and
the high level ranges from V2 to Vdd.

It is assumed that 0<V1<V2<Vdd, and Vdd is the supply voltage. Although not shown, the power supply of each logic gate is supplied with the supply voltage Vdd.

The external control terminal IN is connected to the input terminal of the inverter INV1. The output of the inverter INV1 is inputted to the inverter INV2.

Signals opposite in polarity to each other are inputted to the first and second control terminal Con1a, Con1b which drive the through and shunt FETs on the second terminal RF1 side. The outputs of the inverters INV1 and INV2 are inputted to the first control terminal Con1a and the second control terminal Con1b, respectively. The inverters INV1, INV2 constitute one driver.

Signals opposite in polarity to each other are outputted to the first and second control terminal Con2a, Con2b which drive the through and shunt FETs on the second terminal RF2 side. The output of the selector 13 and the output of the inverter INV3 are inputted to the first control terminal Con2a and the second control terminal Con2b, respectively. The selector 13 and the inverter INV3 constitute one driver. Thus, the controller section 3e includes two drivers.

The selector 13 is a circuit for selecting the input signal to the first control terminal Con1a or the second control terminal Con1b in accordance with a select signal SEL.

The select signal SEL is generated by an intermediate logic level detection circuit 12.

The intermediate logic level detection circuit 12 is composed of inverters INV4, INV5, and an exclusive OR circuit EXOR.

The input signal to the external control terminal IN is inputted to each of the inverters INV4, INV5. The outputs of the inverters INV4, INV5 are inputted to the exclusive OR circuit EXOR, whose output serves as the select signal SEL.

The logic threshold of the inverter INV4 is V1, and the logic threshold of the inverter INV5 is V2.

The intermediate logic level detection circuit 12 is operated as follows.

When the input to the external control terminal IN is low level, the inverters INV4, INV5 both output high level. The output of the exclusive OR circuit EXOR assumes low level, and the select signal SEL assumes low level.

When the input to the external control terminal IN is high level, the inverters INV4, INV5 both output low level. The output of the exclusive OR circuit EXOR assumes low level, and the select signal SEL assumes low level.

When the input to the external control terminal IN is intermediate level, the inverter INV4 outputs low level, and the inverter INV5 outputs high level. The output of the exclusive OR circuit EXOR assumes high level, and the select signal SEL assumes high level.

Hence, when the input to the external control terminal IN is low level or high level, the select signal SEL assumes low level. The selector 13 selects the signal of the second control terminal Con1b for output. The output signal serves as an output to the first control terminal Con2a, hence achieving the function of a normal SPDT switch.

More specifically, when the input to the external control terminal IN is high level, the conducting state is established between the second terminal RF1 and the first terminal RFcom, and the blocking state is established between the second terminal RF2 and the first terminal RFcom. When the input to the external control terminal IN is low level, the conducting state is established between the second terminal RF2 and the first terminal RFcom, and the blocking state is established between the second terminal RF1 and the first terminal RFcom.

On the other hand, when the input to the external control terminal IN is intermediate level, the select signal SEL assumes high level. The selector 13 selects the signal of the first control terminal Con1a for output. The output signal serves as an output to the first control terminal Con2a, hence bringing the two through FETs into the same state. Here, the state of the shunt FETs is opposite to that of the through FETs.

Hence, two cases are possible. In one case, the two through FETs are both turned on, and the two shunt FETs are both turned off. In the other case, the two through FETs are both turned off, and the two shunt FETs are both turned on. These cases are determined by the logic threshold of the inverter INV1.

The logic threshold of the inverter INV1 is set to V1 or V2.

When the logic threshold of the inverter INV1 is set to V1, the inverter INV1 identifies the input signal as high level. Hence, the two through FETs are both turned on, and the two shunt FETs are turned off.

When the logic threshold of the inverter INV1 is set to V2, the inverter INV1 identifies the input signal as low level. Hence, the two through FETs are both turned off, and the two shunt FETs are turned on.

Figure 20:
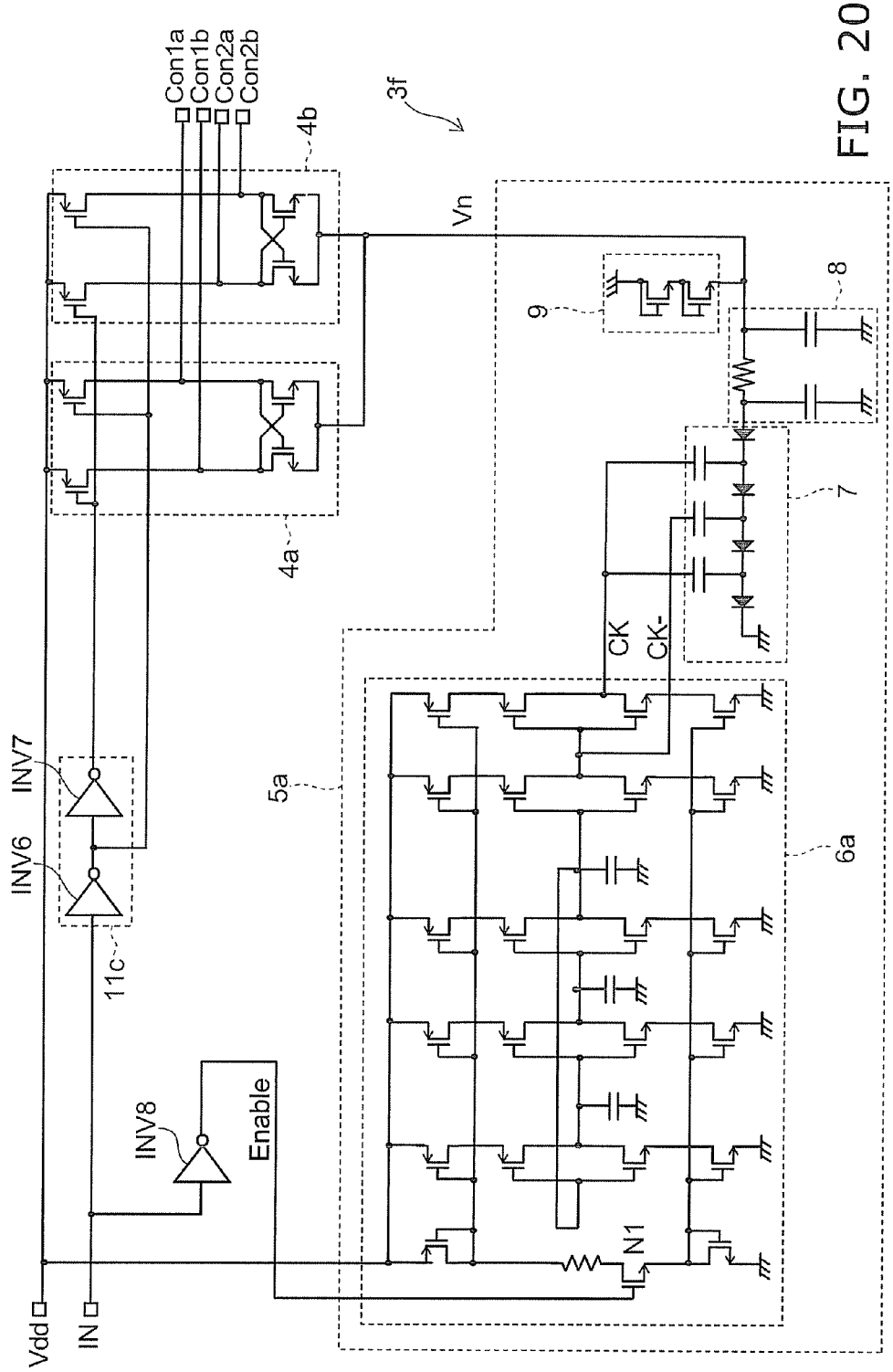
FIG. 20 is a circuit diagram illustrating the configuration of the controller section of the semiconductor switch shown in FIG. 18.

FIG. 20 is a circuit diagram illustrating the configuration of the controller section of the semiconductor switch shown in FIG. 18.

As shown in FIG. 20, the controller section 3f is an example of the controller section 3d of the semiconductor switch 1g shown in FIG. 18.

The controller section 3f includes drivers 4a, 4b, a negative voltage generator (voltage generator) 5a, an inverted/non-inverted signal generator 11c, and an inverter INV8. In this configuration, the negative voltage generator (voltage generator) 5 and the inverted/non-inverted signal generator 11 of the controller section 3 shown in FIG. 2 are replaced by the negative voltage generator (voltage generator) 5a and the inverted/non-inverted signal generator 11c, respectively, and the inverter INV8 is added. It is noted that the input interface circuit is not shown.

In the negative voltage generator (voltage generator) 5a, an NMOS N1 is added to the first-stage current mirror of the ring oscillator 6a. The enable signal Enable to the gate of the NMOS N1 allows the ring oscillator 6a to be switched to the oscillating or halt state. When the enable signal Enable is low level, the NMOS N1 is turned off, and the ring oscillator 6a stops oscillation. When the enable signal Enable is high level, the NMOS N1 is turned on, and the ring oscillator 6a oscillates. The enable signal Enable is generated by inverting the input signal to the external control terminal IN by the inverter INV8.

The inverted/non-inverted signal generator 11c is composed of series connected inverters INV6, INV7, and allows the signal inputted to the external control terminal IN to be differentially outputted to the drivers 4a, 4b.

The signal inputted to the external control terminal IN can assume three values of low level, intermediate level, and high level, where the low level ranges from 0 to V1,
the intermediate level ranges from V1 to V2, and
the high level ranges from V2 to Vdd.

It is assumed that 0<V1<V2<Vdd, and Vdd is the power supply voltage. Although not shown, the power supply of each logic gate, such as the inverter INV8, is supplied with the power supply voltage Vdd.

The logic threshold of the inverter INV6 is V1, and the logic threshold of the inverter INV8 is V2. The logic threshold of the inverter INV7 is set to generally Vdd/2.

This configuration allows the controller section 3f to have a normal operation mode and a sleep mode. Here, the normal operation mode is a mode in which the SPDT switch performs the normal switching operation. The sleep mode is a mode in which the ring oscillator 6a stops operation (oscillation) and does not perform the switch function.

In the normal operation mode, low level and intermediate level signal are supplied to the external control terminal IN. Because the logic threshold of the inverter INV8 is V2, the inverter INV8 identifies its input as low level in the normal operation mode. The output of the inverter INV8, or enable signal Enable, assumes high level (=Vdd). Because the enable signal Enable is high level, the NMOS N1 in the ring oscillator 6a is turned on. Thus, the current mirror is operated, and the ring oscillator 6a performs its function.

Furthermore, in the normal operation mode, the low level and intermediate level signal supplied to the external control terminal IN are identified by the inverter INV6 as low level and high level, respectively.

For instance, when a high level signal is supplied to the external control terminal IN, a low level signal from the inverter INV6 and a high level signal from the inverter INV7 are outputted to the drivers 4a, 4b.

Here, the first control terminal Con1a is subjected to the ON potential Von (=Vdd), and the second control terminal Con2b is subjected to the ON potential Von. Furthermore, the second control terminal Con1b is subjected to the OFF potential Voff (=Vn), and the first control terminal Con2a is subjected to the OFF potential Voff.

In the sleep mode, a high level signal is supplied to the external control terminal IN. The inverter INV8 identifies its input as high level. The output of the inverter INV8, or enable signal Enable, assumes low level (=0 V). Because the enable signal Enable is low level, the NMOS N1 in the ring oscillator 6a is turned off, and the current mirror is not operated. Hence, the ring oscillator 6a does not perform its function, and no power consumption occurs.

In the foregoing, the negative voltage generator (voltage generator) 5 is taken as an example to describe the sleep mode. However, the voltage generator 5 may include a positive voltage generator for generating a positive potential higher than the power supply voltage Vdd and supplying it to the drivers 4a, 4b.

In the foregoing, the SPDT switch is taken as an example to describe the embodiment of the invention. However, a kPlT switch can be constructed likewise, where k, l are natural numbers.

The embodiments of the invention have been described with reference to examples. However, the invention is not limited to these examples. For instance, various specific configurations of the components constituting the semiconductor switch are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the semiconductor switch described above in the embodiments of the invention, and all the semiconductor switches thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A semiconductor switch, comprising:
   a first terminal;
   a second terminal;
   a switch section comprising:
      a through FET connected between the first terminal and the second terminal, the through FET configured to be driven by a first control signal, the through FET comprising a first FET and a second FET connected in series to each other;
      a shunt FET connected between the second terminal and a first ground terminal, the shunt FET configured to be driven by a second control signal;
      a third FET connected between a second ground terminal and a connection node of the first FET and the second FET, and configured to be driven by the second control signal; and
      a first capacitance provided between the first ground terminal and the second ground terminal; and
   a driver provided on a substrate together with the switch section and configured to provide the first control signal and the second control signal.

2. The switch according to claim 1, wherein the substrate is a semiconductor switch substrate having four sides, the switch further comprising:
   a first pad connected to the first terminal and provided along one side of the semiconductor switch substrate;
   ground pads connected to the first and second ground terminal and provided along another side opposed to the one side; and
   a second pad connected to the second terminal and provided next to the ground pads connected to the first and second ground terminal.

3. The switch according to claim 1, wherein the first capacitance is a junction capacitor of a protection diode.

4. The switch according to claim 1, further comprising:
   a second capacitance provided between the second ground terminals.

5. The switch according to claim 4, wherein the substrate is a semiconductor switch substrate having four sides, the switch further comprising:
   a first pad connected to the first terminal and provided along one side of the semiconductor switch substrate;
   ground pads connected to the first and second ground terminal and provided along another side opposed to the one side; and
   a second pad connected to the second terminal and provided next to the ground pads connected to the first and second ground terminal.

* * * * *